(12) United States Patent
Kuk et al.

(10) Patent No.: US 10,566,293 B2
(45) Date of Patent: Feb. 18, 2020

(54) CIRCUIT ELEMENT PACKAGE, MANUFACTURING METHOD THEREOF, AND MANUFACTURING APPARATUS THEREOF

(71) Applicant: SAMSUNG ELECTRONICS CO., LTD., Suwon-si (KR)

(72) Inventors: Keon Kuk, Yongin-si (KR); Young-dae Ko, Suwon-si (KR); O-hyun Beak, Seoul (KR); Eun-bong Han, Suwon-si (KR); Hyeon-hyang Kim, Seoul (KR); Yeon-kyoung Jung, Seoul (KR); Il-ju Mun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/061,233

(22) Filed: Mar. 4, 2016

(65) Prior Publication Data
US 2016/0262292 A1 Sep. 8, 2016

Related U.S. Application Data

(60) Provisional application No. 62/129,245, filed on Mar. 6, 2015.

(30) Foreign Application Priority Data

Nov. 19, 2015 (KR) .......................... 10-2015-0162318

(51) Int. Cl.
*H01L 23/552* (2006.01)
*B05B 15/20* (2018.01)
(Continued)

(52) U.S. Cl.
CPC ............ *H01L 23/552* (2013.01); *B05B 15/20* (2018.02); *H01L 23/24* (2013.01); *H05K 1/0218* (2013.01);
(Continued)

(58) Field of Classification Search
CPC ................ H01L 23/552; H05K 1/0218; H05K 2203/1316; H05K 3/284
See application file for complete search history.

(56) References Cited

U.S. PATENT DOCUMENTS 5,436,203 A * 7/1995 Lin .......................... H01L 23/24
257/E23.069
5,641,438 A  6/1997 Bunyan et al.
(Continued)

FOREIGN PATENT DOCUMENTS

CN   101785097 A   7/2010
EP   2187435 A1    5/2010
(Continued)

OTHER PUBLICATIONS

Kim, et al., "Onset condition of pulsating cone-jet mode of electrohydrodynamic jetting for plane, hole, and pin type electrodes", Journal of Applied Physics, vol. 108, 2010, 11 pages total.
(Continued)

*Primary Examiner* — Timothy J Thompson
*Assistant Examiner* — Rhadames Alonzo Miller
(74) *Attorney, Agent, or Firm* — Sughrue Mion, PLLC

(57) ABSTRACT

A circuit element package, a manufacturing method thereof, and a manufacturing apparatus thereof are provided. The circuit element package includes a circuit element disposed on a printed circuit board, an insulating layer covering the circuit element, a first shielding layer covering a side surface of the insulating layer, and a second shielding layer covering an upper surface of the insulating layer and electrically connected to the first shielding layer.

13 Claims, 35 Drawing Sheets

(51) Int. Cl.
*H05K 3/28* (2006.01)
*H01L 23/24* (2006.01)
*H05K 1/02* (2006.01)
*H01L 23/498* (2006.01)
*H01L 23/00* (2006.01)

(52) U.S. Cl.
CPC ........ H05K 3/284 (2013.01); *H01L 23/49838* (2013.01); *H01L 24/13* (2013.01); *H01L 24/16* (2013.01); *H01L 2224/131* (2013.01); *H01L 2224/16227* (2013.01); *H01L 2924/19041* (2013.01); *H01L 2924/19042* (2013.01); *H01L 2924/19043* (2013.01); *H01L 2924/19105* (2013.01); *H05K 2201/0715* (2013.01); *H05K 2203/0126* (2013.01); *H05K 2203/1316* (2013.01)

(56) References Cited

U.S. PATENT DOCUMENTS

| | | | |
|---|---|---|---|
| 5,650,659 A * | 7/1997 | Mostafazadeh | H01L 23/315 257/659 |
| 5,761,053 A | 6/1998 | King et al. | |
| 6,092,281 A * | 7/2000 | Glenn | H01L 23/24 29/841 |
| 6,150,193 A * | 11/2000 | Glenn | H01L 21/56 257/E21.502 |
| 6,263,564 B1 | 7/2001 | Holmberg et al. | |
| 6,297,551 B1 | 10/2001 | Dudderar et al. | |
| 6,466,174 B2 | 10/2002 | Haussler et al. | |
| 6,601,293 B1 * | 8/2003 | Glenn | H01L 23/24 29/841 |
| 6,933,894 B2 | 8/2005 | Ghosh et al. | |
| 6,962,829 B2 * | 11/2005 | Glenn | H01L 21/56 257/E21.502 |
| 7,015,869 B2 | 3/2006 | Marlow et al. | |
| 7,141,869 B2 | 11/2006 | Kim et al. | |
| 7,196,275 B2 * | 3/2007 | Babb | H01L 23/552 174/377 |
| 7,311,937 B2 | 12/2007 | Hashimoto | |
| 7,482,686 B2 * | 1/2009 | Zhao | H01L 23/24 257/687 |
| 7,633,015 B2 * | 12/2009 | Wurzel | H01L 23/552 174/260 |
| 7,752,751 B2 | 7/2010 | Kapusta et al. | |
| 7,981,730 B2 | 7/2011 | Tang et al. | |
| 8,071,893 B2 * | 12/2011 | Lin | H05K 1/0218 174/387 |
| 8,276,268 B2 | 10/2012 | Kapusta et al. | |
| 8,314,485 B2 | 11/2012 | Ono et al. | |
| 8,633,403 B2 | 1/2014 | Lin et al. | |
| 8,881,387 B2 | 11/2014 | Lin et al. | |
| 8,971,553 B2 | 3/2015 | Takaoka | |
| 9,192,057 B2 * | 11/2015 | Malek | H05K 9/003 |
| 9,572,264 B2 | 2/2017 | Yamamoto et al. | |
| 9,640,858 B1 | 5/2017 | Islam et al. | |
| 9,768,154 B2 | 9/2017 | Tomonari et al. | |
| 2001/0033478 A1 | 10/2001 | Ortiz et al. | |
| 2004/0087043 A1 * | 5/2004 | Lee | B81C 1/00269 438/6 |
| 2004/0231872 A1 * | 11/2004 | Arnold | H01L 23/04 174/377 |
| 2005/0045358 A1 * | 3/2005 | Arnold | H05K 9/0024 174/51 |
| 2005/0280139 A1 * | 12/2005 | Zhao | H01L 23/24 257/704 |
| 2007/0030661 A1 * | 2/2007 | Morris | C23C 30/00 361/818 |
| 2007/0176281 A1 * | 8/2007 | Kim | H01L 23/3128 257/700 |
| 2007/0187136 A1 | 8/2007 | Higashiguchi et al. | |
| 2007/0230131 A1 * | 10/2007 | Bunyan | C08K 7/16 361/704 |
| 2008/0044744 A1 | 2/2008 | Yamazaki et al. | |
| 2008/0292846 A1 * | 11/2008 | Muranaga | H01L 23/053 428/157 |
| 2009/0244876 A1 * | 10/2009 | Li | H05K 9/0032 361/818 |
| 2009/0244878 A1 | 10/2009 | Wurzel et al. | |
| 2010/0045181 A1 | 2/2010 | Oh et al. | |
| 2010/0188292 A1 | 7/2010 | Rutfors | |
| 2010/0200983 A1 | 8/2010 | Ono et al. | |
| 2010/0230789 A1 * | 9/2010 | Yorita | H01L 23/3121 257/659 |
| 2010/0327431 A1 * | 12/2010 | Touzelbaev | B23K 1/0016 257/712 |
| 2011/0006106 A1 * | 1/2011 | Kanryo | H01L 23/552 228/170 |
| 2012/0023743 A1 | 2/2012 | Lin et al. | |
| 2012/0104571 A1 * | 5/2012 | Yoo | H01L 23/552 257/659 |
| 2012/0218727 A1 | 8/2012 | Kim | |
| 2012/0320558 A1 | 12/2012 | Foster et al. | |
| 2013/0083501 A1 * | 4/2013 | Azzopardi | B81C 1/00269 361/757 |
| 2013/0114228 A1 | 5/2013 | Merz et al. | |
| 2013/0241039 A1 | 9/2013 | Choi et al. | |
| 2013/0286609 A1 | 10/2013 | Merz | |
| 2014/0002310 A1 | 1/2014 | Kim | |
| 2014/0071634 A1 | 3/2014 | Pakula et al. | |
| 2014/0126157 A1 | 5/2014 | Sawatari et al. | |
| 2014/0160699 A1 | 6/2014 | Zhang et al. | |
| 2014/0198459 A1 * | 7/2014 | Cheng | H01L 23/3135 361/730 |
| 2014/0271961 A1 | 9/2014 | Khoshnevis | |
| 2015/0016066 A1 | 1/2015 | Shimamura et al. | |
| 2015/0022978 A1 * | 1/2015 | Steuer | H05K 1/144 361/749 |
| 2015/0022986 A1 * | 1/2015 | Steuer | H05K 9/0022 361/767 |
| 2015/0036297 A1 | 2/2015 | Chen et al. | |
| 2015/0043189 A1 | 2/2015 | Kitazaki et al. | |
| 2015/0070851 A1 | 3/2015 | Kitazaki et al. | |
| 2015/0206852 A1 | 7/2015 | Lin et al. | |
| 2015/0214602 A1 | 7/2015 | Hobson et al. | |
| 2016/0066481 A1 | 3/2016 | Malek et al. | |
| 2016/0066482 A1 | 3/2016 | Chi et al. | |
| 2016/0091575 A1 | 3/2016 | Yamada et al. | |
| 2016/0157392 A1 * | 6/2016 | Happoya | G06F 1/1656 361/816 |
| 2016/0262292 A1 | 9/2016 | Kuk et al. | |
| 2017/0117615 A1 | 4/2017 | Choon et al. | |
| 2017/0251549 A1 | 8/2017 | Lee et al. | |
| 2017/0295679 A1 * | 10/2017 | Kim | B29C 45/14639 |
| 2017/0325365 A1 * | 11/2017 | Kuk | H05K 9/0032 |
| 2018/0116078 A1 | 4/2018 | Mun et al. | |

FOREIGN PATENT DOCUMENTS

| | | |
|---|---|---|
| JP | 6-283883 A | 10/1994 |
| JP | 2001-251088 A | 9/2001 |
| JP | 2004-048762 A | 2/2004 |
| JP | 2011-124598 A | 6/2011 |
| JP | 2011-146779 A | 7/2011 |
| JP | 2015-65343 A | 4/2015 |
| JP | 2016-111026 A | 6/2016 |
| KR | 10-0321429 B1 | 3/2002 |
| KR | 10-2006-0083770 A | 7/2006 |
| KR | 10-0618085 B1 | 8/2006 |
| KR | 10-0742098 B1 | 7/2007 |
| KR | 10-2010-0064008 A | 6/2010 |
| KR | 10-2012-0127852 A | 11/2012 |
| KR | 10-2014-0111739 A | 9/2014 |
| KR | 10-2014-0132880 A | 11/2014 |
| KR | 10-1579623 B1 | 12/2015 |
| KR | 10-2016-0031572 A | 3/2016 |
| KR | 10-2016-0044953 A | 4/2016 |
| KR | 10-2016-0045336 A | 4/2016 |
| KR | 10-2016-0108117 A | 9/2016 |
| KR | 10-2017-0125690 A | 11/2017 |
| KR | 10-2018-0087551 A | 8/2018 |

(56) References Cited

FOREIGN PATENT DOCUMENTS

| KR | 10-2018-0101831 A | 9/2018 |
|---|---|---|
| WO | 2004/047510 A2 | 6/2004 |
| WO | 2005/029937 A1 | 3/2005 |
| WO | 2016/144039 A1 | 9/2016 |
| WO | 2017/111956 A1 | 6/2017 |
| WO | 2017/191888 A1 | 11/2017 |

OTHER PUBLICATIONS

Baek, et al., "3D Printing Process for Mass Production of PCB Component", DMC R&D Center, Samsung Electronics, 2015, pp. 1-7.

International Search Report (PCT/ISA/210) dated Apr. 20, 2017, issued by the International Searching Authority in counterpart International Patent Application No. PCT/KR2017/001370.

Written Opinion (PCT/ISA/237) dated Apr. 20, 2017, issued by the International Searching Authority in counterpart International Patent Application No. PCT/KR2017/001370.

International Search Report (PCT/ISA/210) dated Jun. 27, 2016, issued by the International Searching Authority in counterpart International Application No. PCT/KR2016/002111.

Written Opinion (PCT/ISA/237) dated Jun. 27, 2016, issued by the International Searching Authority in counterpart International Application No. PCT/KR2016/002111.

Office Action dated Jan. 11, 2018, issued by the United States Patent and Trademark Office in U.S. Appl. No. 15/386,823.

Office Action dated Jan. 17, 2018, issued by the United States Patent and Trademark Office in U.S. Appl. No. 15/489,190.

Communication dated Feb. 21, 2018, issued by the European Patent Office in counterpart European application No. 16761926.1.

Office Action dated Aug. 9, 2018, issued by the U.S. Patent and Trademark Office in U.S. Appl. No. 15/386,823.

Communication dated May 25, 2018, issued by the European Patent Office in counterpart European Application No. 16761926.1.

International Search Report dated Oct. 22, 2018 issued by the International Searching Authority in counterpart International Application No. PCT/KR2018/007746 (PCT/ISA/210).

Written Opinion dated Oct. 22, 2018 issued by the International Searching Authority in counterpart International Application No. PCT/KR2018/007746 (PCT/ISA/237).

Office Action dated Nov. 8, 2018 issued by the United States Patent Office in U.S. Appl. No. 15/488,024.

Notice of Allowance dated Oct. 5, 2018 issued by the United States Patent Office in U.S. Appl. No. 15/489,190.

Notice of Allowance dated Oct. 30, 2018 issued by the United States Patent Office in U.S. Appl. No. 15/386,823.

Office Action dated Apr. 10, 2019, issued by the United States Patent and Trademark Office in U.S. Appl. No. 15/488,024.

International Search Report (PCT/ISA/210) dated Dec. 17, 2018, issued by the International Searching Authority in counterpart International Patent Application PCT/KR2018/010501.

Written Opinion (PCT/ISA/237) dated Dec. 17, 2018, issued by the International Searching Authority in counterpart International Patent Application PCT/KR2018/010501.

Communication dated Feb. 12, 2019, issued by the European Patent Office in counterpart European Patent Application No. 17792791.0.

Office Action dated Mar. 1, 2019, issued by the United States Patent and Trademark Office in U.S. Appl. No. 16/124,836.

Communication dated Jul. 22, 2019, from the State Intellectual Property Office of People's Republic of China in counterpart Application No. 201680014167.0.

Communication dated Jun. 27, 2019, from the State Intellectual Property Office of People's Republic of China in counterpart Application No. 201780028105.X.

Office Action dated Jul. 19, 20199, issued by the U.S. Patent and Trademark Office in U.S. Appl. No. 16/020,386.

* cited by examiner (a)

(b)

(c)

(d)

(e)

(a)

(b)

CIRCUIT ELEMENT PACKAGE, MANUFACTURING METHOD THEREOF, AND MANUFACTURING APPARATUS THEREOF

CROSS-REFERENCE TO RELATED APPLICATIONS

This application claims priority from Korean Patent Application No. 10-2015-0162318 filed on Nov. 19, 2015 in the Korean Intellectual Property Office, and U.S. Provisional Application No. 62/129,245 filed on Mar. 6, 2015 in the United States Patent and Trademark Office, the disclosures of which are incorporated herein by reference in their entireties.

BACKGROUND

Field

Apparatuses and methods consistent with exemplary embodiments relate to a circuit element package, a manufacturing method thereof, and a manufacturing apparatus thereof, and more particularly, to a circuit element package having an electromagnetic shielding member that can protect a semiconductor chip or passive elements included in the package and can shield electromagnetic waves, a manufacturing method thereof, and a manufacturing apparatus thereof.

Description of the Related Art

Recently, demand for portable devices has been abruptly increased in the electronic product market, and due to this, miniaturization and reduction of weight of electronic components that are mounted on such electronic products are continuously occurring. To realize the miniaturization and reduction of weight of electronic components, not only a technology that can reduce individual sizes of the mounted components but also a semiconductor package technology that can integrate individual elements into one package are used. A semiconductor package that processes a high-frequency signal uses not only miniaturization but also various electromagnetic shielding structures for prominently implementing electromagnetic interference or electromagnetic tolerance characteristics.

For this, an electromagnetic shielding structure in the related art that is applied to a semiconductor package is configured so that a shield can of a press-processed metal material is provided to cover elements (e.g., semiconductor chip or passive elements) mounted on a printed circuit board, and the shield can is fixed onto the printed circuit board through soldering with ground terminals of the printed circuit board.

According to the electromagnetic shielding structure in the related art, however, the inner surface of the metal shield can is upwardly spaced apart from upper ends of the elements for a predetermined distance so that a predetermined air gap is provided between the elements and the inner surface of a cover to prevent a short circuit between the inner surface of the metal shield can and the elements. Due to such an air gap, the overall height of the electromagnetic shielding structure is increased. Further, the thermal insulation effect that occurs due to the air gap may be an obstacle to the dissipation of heat that is generated from the elements out of the shield can, and heat dissipation holes are formed for ventilation on the shield can to overcome the obstacle. However, such heat dissipation holes may cause the electromagnetic shielding performance to deteriorate.

SUMMARY

Exemplary embodiments may address at least the above problems and/or disadvantages and other disadvantages not described above. Also, the exemplary embodiments are not required to overcome the disadvantages described above, and may not overcome any of the problems described above.

One or more exemplary embodiments provide a circuit element package having electromagnetic shielding characteristics with a minimum thickness, a manufacturing method thereof, and a manufacturing apparatus thereof.

According to an aspect of an exemplary embodiment, there is provided a circuit element package including a circuit element disposed on a printed circuit board, an insulating layer covering the circuit element, a first shielding layer covering a side surface of the insulating layer, and a second shielding layer covering an upper surface of the insulating layer and electrically connected to the first shielding layer.

The first shielding layer may include an electromagnetic shielding material having a viscosity greater than a viscosity of the insulating layer.

The circuit element package may further include an edge bridge electrically connecting the first shielding layer to the second shielding layer.

The second shielding layer may be disposed on an upper surface of the insulating layer and an upper surface of the edge bridge.

The circuit element package may further include an epoxy underfill through which the circuit element is disposed on the printed circuit board, and gas discharge holes disposed in portions of the first shielding layer and discharging gas that is generated by the epoxy underfill.

The circuit element package may further include a ground pad disposed on the printed circuit board, and a skirt portion disposed on an upper surface of the ground pad. The first shielding layer may be disposed on an upper surface of the skirt portion.

The circuit element package may further include an insulating adhesive layer disposed on a bottom surface of the second shielding layer and covering the circuit element having a height greater than a height of the insulating layer.

The insulating layer may include an insulating mold having an open bottom surface and a space disposed in the insulating mold.

The insulating layer may be disposed on a bottom surface of the second shielding layer, and an air gap may be disposed inside the first shielding layer.

The second shielding layer may include through-holes disposed along sides of the second shielding layer, and the circuit element package may further include a connection layer disposed along a circumferential portion of an upper surface of the second shielding layer on which the through-holes are disposed, disposed in the through-holes, and electrically connecting the first shielding layer to the second shielding layer.

According to an aspect of an exemplary embodiment, there is provided a method of manufacturing a circuit element package, the method including forming a circuit element on a printed circuit board, forming an insulating layer covering the circuit element, and forming a shielding layer covering the insulating layer. The shielding layer includes a first shielding layer covering a side surface of the insulating layer, and a second shielding layer covering an upper surface of the insulating layer and electrically connected to the first shielding layer.

The forming the insulating layer may include injecting the insulating layer in the first shielding layer, and curing the insulating layer.

The forming the shielding layer may include forming simultaneously an upper portion and a lower portion of the first shielding layer.

The method may further include varying a temperature of a material of the insulating layer or vibrate the material of the insulating layer before the forming the insulating layer to vary a viscosity of the material of the insulating layer, and varying a temperature of a material of the shielding layer or vibrate the material of the shielding layer before the forming the shielding layer to vary a viscosity of the material of the shielding layer.

The method may further include forming an edge bridge electrically connecting the first shielding layer to the second shielding layer in response to the forming the shielding layer.

According to an aspect of an exemplary embodiment, there is provided an apparatus for manufacturing a circuit element package, the apparatus including a dispenser; a driver configured to move the dispenser; and a controller configured to control the dispenser and the driver, wherein the dispenser includes a storage chamber configured to store a material of an insulating layer or a shielding layer, a material viscosity variator configured to vary a viscosity of the stored material, and a nozzle configured to discharge the varied material.

The material viscosity variator may include a vibrator disposed in the storage chamber and configured to vibrate the stored material, and the controller may be further configured to control the vibrator to apply a shear stress to the material using a thixotropy of the material to vary the viscosity of the material.

The nozzle may include a first discharger disposed on a side surface of the nozzle and having a height greater than a width of the first discharger, and a second discharger disposed on a lower end of the nozzle and configured to communicate with the first discharger.

The nozzle may include an upper discharge port disposed on a side surface of the nozzle, and a lower discharge port disposed on the side surface of the nozzle, disposed on a lower side of the upper discharge port, and disposed forward the upper discharge port.

The nozzle may include three or more discharge ports on a side surface of the nozzle in upward and downward directions.

BRIEF DESCRIPTION OF THE DRAWINGS

The above and/or other aspects will be more apparent by describing exemplary embodiments with reference to the accompanying drawings, in which.

DETAILED DESCRIPTION OF THE EXEMPLARY EMBODIMENTS

Figure 1:
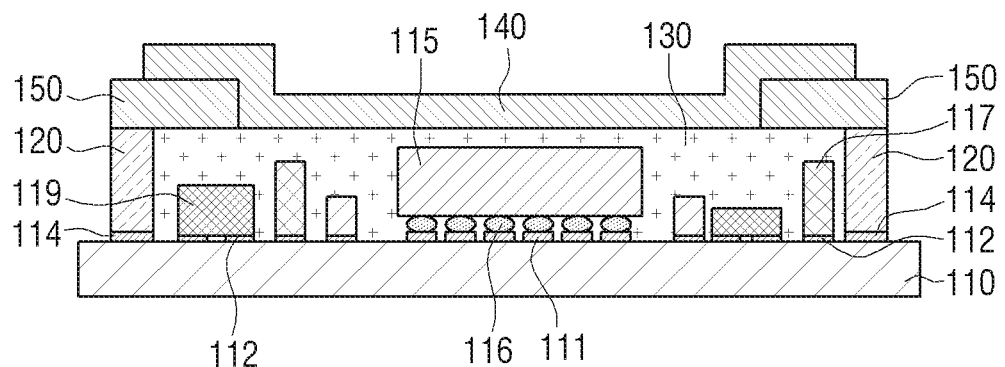
FIG. 1 is a cross-sectional view illustrating a circuit element package according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions may not be described in detail because they would obscure the description with unnecessary detail.

It will be understood that the terms "comprises" and/or "comprising" used herein specify the presence of stated features or components, but do not preclude the presence or addition of one or more other features or components. In addition, the terms such as "unit," "-er (-or)," and "module" described in the specification refer to an element for performing at least one function or operation, and may be implemented in hardware, software, or the combination of hardware and software.

Further, in exemplary embodiments, a structure of a circuit element package that shields a semiconductor chip and passive elements together is exemplarily described, but is not limited thereto. A structure that shields only the semiconductor chip and a structure that shields only the passive elements may also be described.

Further, a circuit element package according to exemplary embodiments may be applied to a smart phone, a display device, and a wearable device.

FIG. 1 is a cross-sectional view illustrating a circuit element package 100 according to an exemplary embodiment.

Referring to FIG. 1, the circuit element package 100 includes a printed circuit board 110, a semiconductor chip 115 mounted on the printed circuit board 110, and passive elements 117 and 119. On an upper surface of the printed circuit board 110, a first connection pad 111 and a second connection pad 112 are patterned to electrically connect the semiconductor chip 115 and the passive elements 117 and 119 to the printed circuit board 110. A plurality of first and second connection pads 111 and 112 are provided. The first and second connection pads 111 and 112 may be formed for grounding or signal transfer of the semiconductor chip 115 and the passive elements 117 and 119.

A ground pad 114 is patterned on an upper surface of the printed circuit board 110. The ground pad 114 may be formed for grounding or signal transfer of the semiconductor chip 115 and the passive elements 117 and 119. The ground pad 114 is grounded to a first shielding layer 120.

The semiconductor chip 115 includes a plurality of connection terminals 116 that are electrically connected to the first connection pads 111 of the printed circuit board 110. The plurality of connection terminals 116 may be formed, for example, in a BGA (Ball Grid Array) method to be solder balls, and may be referred to as a BGA 116.

The passive elements 117 and 119 (e.g., resistors, capacitors, and inductors) may include at least one connection terminal that is electrically connected to the second connection pad 112 of the printed circuit board 110. The height of the passive elements 117 and 119 that are mounted on the printed circuit board 110 may be lower or higher than the height of the semiconductor chip 115, and the semiconductor chip 115 and the passive elements 117 and 119 may be covered by the insulating layer 130 to be isolated from the first shielding layer 120.

The circuit element package 100 includes the first shielding layer 120, an insulating layer 130, a second shielding layer 140, and an edge bridge 150 on the printed circuit board 110.

The first and second shielding layers 120 and 140 and the edge bridge 150 may be formed of a material having electromagnetic shielding characteristics that can prevent electromagnetic interference (EMI). Accordingly, the first and second shielding layers 120 and 140 and the edge bridge 150 can shield electromagnetic waves generated from the semiconductor chip 115 and the passive elements 117 and 119, and thus can prevent in advance the EMI that may be given to other electronic components mounted on an electronic device that includes the circuit element package 100. Accordingly, obstacles, such as electromagnetic noise and malfunction, can be intercepted in the electronic device that includes the circuit element package 100, and thus reliability of the product can be prevented from deteriorating. As described above, the first and second shielding layers 120 and 140 can prevent the electromagnetic waves that are unavoidably generated during an operation process of the circuit element package 100 from exerting an influence on an outside.

The first shielding layer 120 forms a side surface of the shielding layer, and the second shielding layer 140 forms an upper surface of the shielding layer. The first and second shielding layers 120 and 140 cover the insulating layer 130.

The first shielding layer 120 is connected to the ground pad 114, and may be in a closed loop shape to surround the semiconductor chip 115 and the passive elements 117 and 119. For example, the first shielding layer 120 may be in a rectangular shape, but is not limited thereto.

The insulating layer 130 is formed inside the first and second shielding layers 120 and 140, and covers the semiconductor chip 115 and the passive elements 117 and 119. The insulating layer 130 may isolate the semiconductor chip 115 and the passive elements 117 and 119 from the first and second shielding layers 120 and 140.

The insulating layer 130 may be made of a material having fluidity so that it is injected into a region that is partitioned by the first shielding layer 120 in a dam shape and comes in close contact with the outsides of the semiconductor chip 115 and the passive elements 117 and 119. Further, the insulating layer 130 may isolate the connection pad 112 (one among the connection pads 111 and 112) that is arranged in the outermost portion from the ground pad 114.

The insulating layer that is injected into a partition region of the first shielding layer 120 may be cured in a predetermined shape through a curing process, such as ambient curing, thermal curing, or UV curing.

The insulating layer 130 may be formed using a thixotropic material or a hot melt material. The first shielding layer 120, the second shielding layer 140, and the edge bridge 150 may also be formed using the thixotropic material or hot melt material.

The thixotropic material may include at least one among synthetic fine silica, bentonite, fine particle surface processing calcium carbonate, hydrogenated castor oil, metal soap, aluminum stearate, polyamide wax, polyethylene oxide, and linseed polymerized oil. For example, metal soap may include aluminum stearate.

A hot melt material may include at least one among polyurethane, polyurea, polyvinyl chloride, polystyrene, ABS (Acrylonitrile Butadiene Styrene), polyamide, acryl, and PBTP (Polybutylene Terephthalate).

The thixotropic material or the hot melt material may be cured through UV curing or thermal curing. The thixotropic material or the hot melt material having fluidity can be easily injected through a dispenser, and then can be cured through UV curing or thermal curing to seek process convenience. The thixotropic material may be polymer including metal filler.

Further, the insulating layer 130, the first and second shielding layers 120 and 140, and the edge bridge 150 according to an exemplary embodiment may be formed through 3D printing. Accordingly, costs for expensive equipment and manufacturing time can be saved.

The second shielding layer 140 may be formed by spreading the material that is discharged from the dispenser so that the material covers the upper surface of the insulating layer 130 and the upper surface of the edge bridge 150. The second shielding layer 140 may also be made of the same material as the material of the first shielding layer 120, and the viscosity of the second shielding layer 140 may also be set to be the same as the viscosity of the first shielding layer 120.

The edge bridge 150 is formed to cover the boundary between the first shielding layer 120 and the insulating layer 130 and the periphery thereof. For example, the edge bridge 150 may be formed to be bent at about 90° so that the edge bridge 150 is laminated on the upper surface of the first shielding layer 120 and covers the peripheral portion of the insulating layer 130. As described above, because the edge bridge 150 connects the first and second shielding layers 120 and 140 to each other, the ground region can be extended from the first shielding layer 120 to the second shielding layer 140.

The edge bridge 150 may be made of the same material as the first and second shielding layers 120 and 140, i.e., a material having the electromagnetic shielding characteristics. As described above, the edge bridge 150 that is provided in the circuit element package 110 according to an exemplary embodiment can shield the electromagnetic waves that are generated from the semiconductor chip 115 and the passive elements 117 and 119 more effectively together with the first and second shielding layers 120 and 140.

Figure 2:
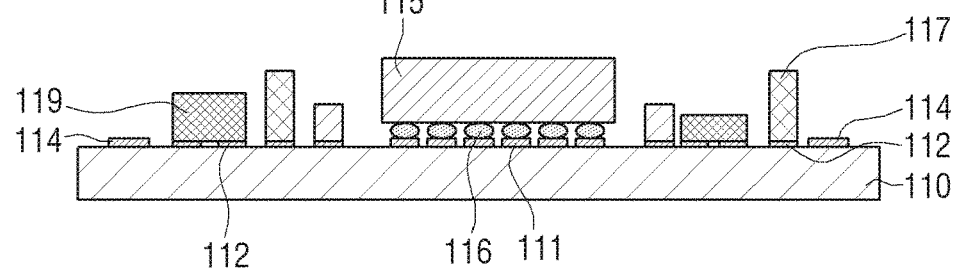
FIG. 2 is a cross-sectional view successively illustrating a process of manufacturing the circuit element package of FIG. 1 according to an exemplary embodiment.
Figure 2:
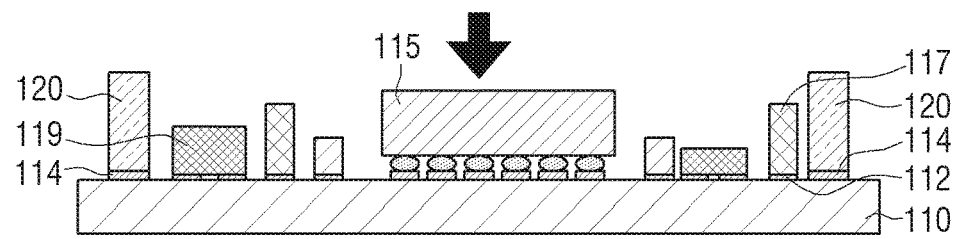
Figure 2:
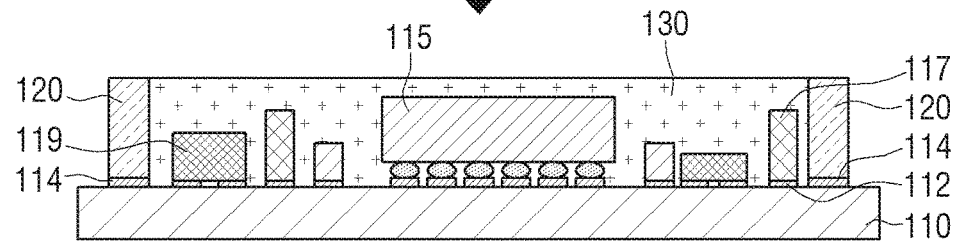
Figure 2:
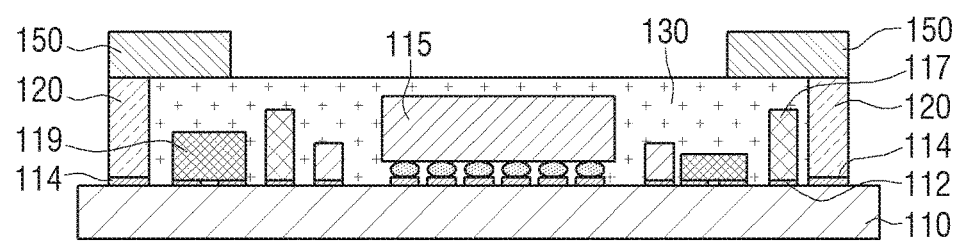
Figure 2:
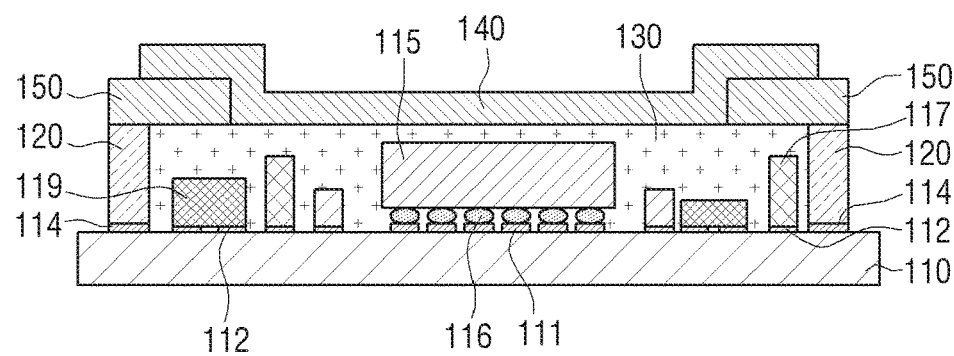

FIG. 2 is a cross-sectional view successively illustrating a process of manufacturing the circuit element package 100 of FIG. 1 according to an exemplary embodiment.

Referring to portion (a) of FIG. 2, the connection pads 111 and 112 and the ground pad 114 are patterned on the upper surface of the printed circuit board 110, and then the semiconductor chip 115 and the passive elements 117 and 119 are bonded to the connection pads 111 and 112 so that the semiconductor chip 115 and the passive elements 117 and 119 are electrically connected to the connection pads 111 and 112.

Referring to portion (b) of FIG. 2, the first shielding layer 120 is formed on the upper surface of the printed circuit board 110 to be connected to the ground pad 114. The first shielding layer 120 may be substantially in a closed loop shape to surround the semiconductor chip 115 and the passive elements 117 and 119. In this case, the first shielding layer 120 is made of a fluid material having high viscosity so that the first shielding layer 120 is formed to be higher than the semiconductor chip 115 and the passive elements 117 and 119.

Referring to portion (c) of FIG. 2, the insulating layer 130 is formed on the inside of the first shielding layer 120 that is formed substantially in a dam shape. The material that forms the insulating layer 130 may have lower viscosity than the viscosity of the material of the first shielding layer 120 so that the material of the insulating layer 130 has higher fluidity than the fluidity of the material that forms the first shielding layer 120. The material that forms the insulating layer 130 (any one among a thixotropic material, a hot melt material, and a polymer including a metal filler) secures high fluidity, and may fill between the semiconductor chip 115 and the passive elements 117 and 119 and the upper surface of the printed circuit board 110 when the material of the insulating layer 130 is injected into the shielding region that is partitioned by the first shielding layer 120. The fluid material that is injected with a predetermined height is cured through the ambient curing, UV curing, or thermal curing process.

Referring to portion (d) of FIG. 2, the edge bridge 150 is formed to simultaneously overlap the upper surface of the first shielding layer 120 and the upper surface of the insulating layer 130. In this case, because the edge bridge 150 is limitedly spread on the peripheral portion of the upper surface of the insulating layer 130, a space (roughly in a groove shape), into which the second shielding layer 140 to be formed in the next process is to be injected, may be provided in the center portion of the upper surface of the insulating layer 130 due to a step height that is caused by the thickness of the edge bridge 150.

Referring to portion (e) of FIG. 2, the second shielding layer 140 is formed on the upper surface of the cured insulating layer 130 and the upper surface of the edge bridge 150. In this case, because the first shielding layer 120 that is connected to the ground pad 114 is electrically connected to the second shielding layer 140 through the edge bridge 150, the ground region can be extended up to the upper surface of the second shielding layer 140, and thus a stable ground path can be provided.

Figure 3A:
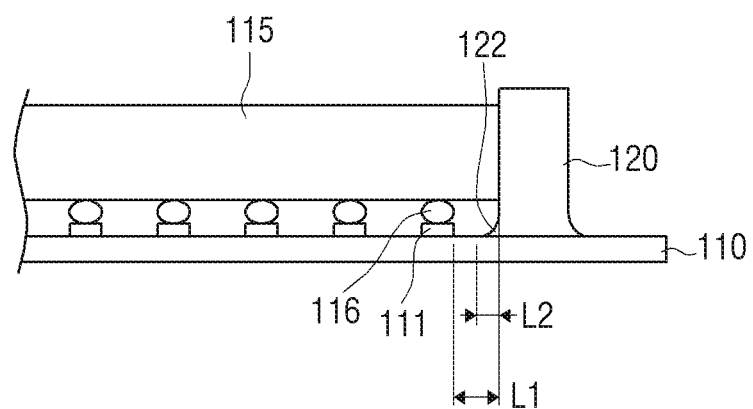
FIG. 3A is a cross-sectional view illustrating an interval between a first shielding layer and a BGA of a semiconductor chip in the case of shielding the semiconductor chip only, according to an exemplary embodiment.
Figure 3B:
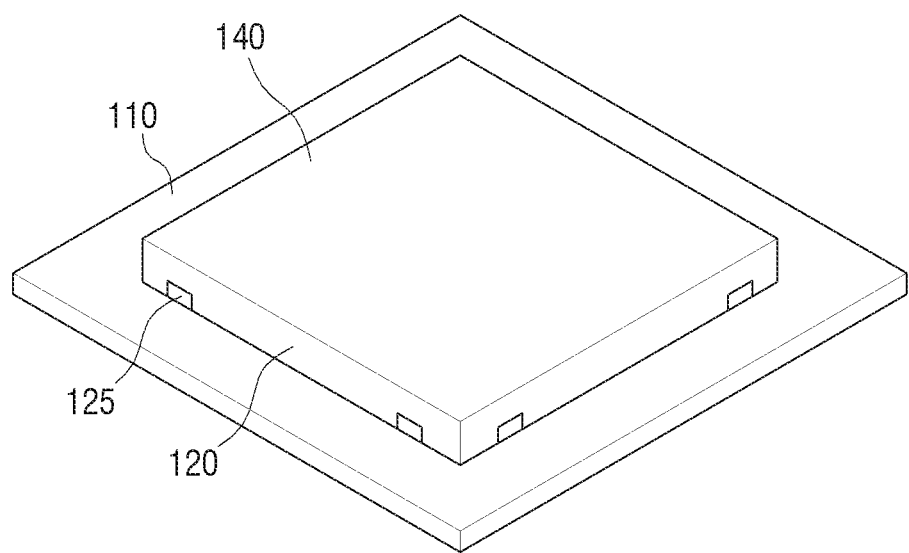
FIGS. 3B and 3C are a perspective view and a cross-sectional view illustrating a circuit element package using epoxy resin to achieve firm coupling between a semiconductor chip and a printed circuit board, according to an exemplary embodiment.
Figure 3C:
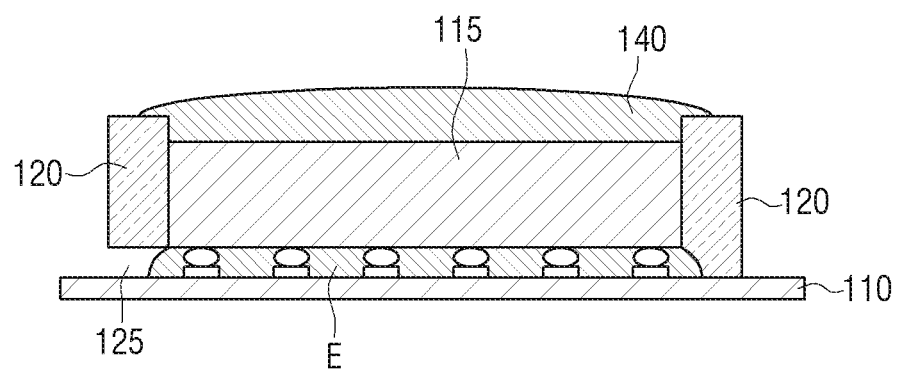

In an exemplary embodiment, the circuit element package is configured to shield the semiconductor chip 115 only, as shown in FIGS. 3A to 3C, without shielding both the semiconductor chip 115 and the passive elements 117 and 119.

FIG. 3A is a cross-sectional view illustrating an interval between the first shielding layer 120 and the BGA 116 of the semiconductor chip 115 in the case of shielding the semiconductor chip 115 only, according to an exemplary embodiment.

Referring to FIG. 3A, in the case of shielding only the semiconductor chip 115, the outermost terminal of the BGA (Ball Grid Array) 116 that includes electrodes formed on the bottom surface of the semiconductor chip 115 is electrically insulated from the first shielding layer 120. For this, the material supplied through a nozzle 216 (of FIG. 4A) does not come in contact with the BGA 116 by controlling a distance in which the material is injected onto the bottom surface of the semiconductor chip 115 through adjustment of the physical properties (surface tension, viscosity, density, and thixotropy) of the material that forms the first shielding layer 120 and material supply variables (supply pressure, transport speed, material supply amount, gap of a semiconductor chip supply device, and gap of a printed circuit board supply device). That is, if it is assumed that the distance between the outer surface of the semiconductor chip 115 and the outermost BGA 116 is L1 and a length of an underfill 122 of the material that forms the first shielding layer 120, which is directed from the outer surface of the semiconductor chip 115 to the outermost BGA 116 is L2, the condition of L1>L2 is satisfied.

FIGS. 3B and 3C are a perspective view and a cross-sectional view illustrating a circuit element package using epoxy resin to achieve firm coupling between the semiconductor chip 115 and the printed circuit board 110, according to an exemplary embodiment.

Referring to FIGS. 3B and 3C, in the case in which an epoxy underfill E is used as one among methods for mounting a semiconductor chip 115 to improve reliability of the products through an increase of an attachment force between the semiconductor chip 115 and the printed circuit board 110, the shielding structure according to an exemplary embodiment may be modified to be applied.

That is, the material that forms the shielding layer is a polymer-based material that is similar to the material of the underfill, and thus can be cured through ambient curing or thermal curing simultaneously with the underfill. However, if the outline of the underfill material is completely surrounded by the material that forms the shielding layer, gas that is included in the epoxy underfill E is confined in the shielding structure during curing of the epoxy underfill E. Accordingly, the circuit element package may cause a reliability problem when the temperature is increased. To prevent this, gas discharge holes 125 are formed at predetermined intervals in partial positions or portions of the first shielding layer 120, and correspond to a gap portion between the semiconductor chip 115 and the printed circuit board 110 to discharge the generated gas.

Figure 4A:
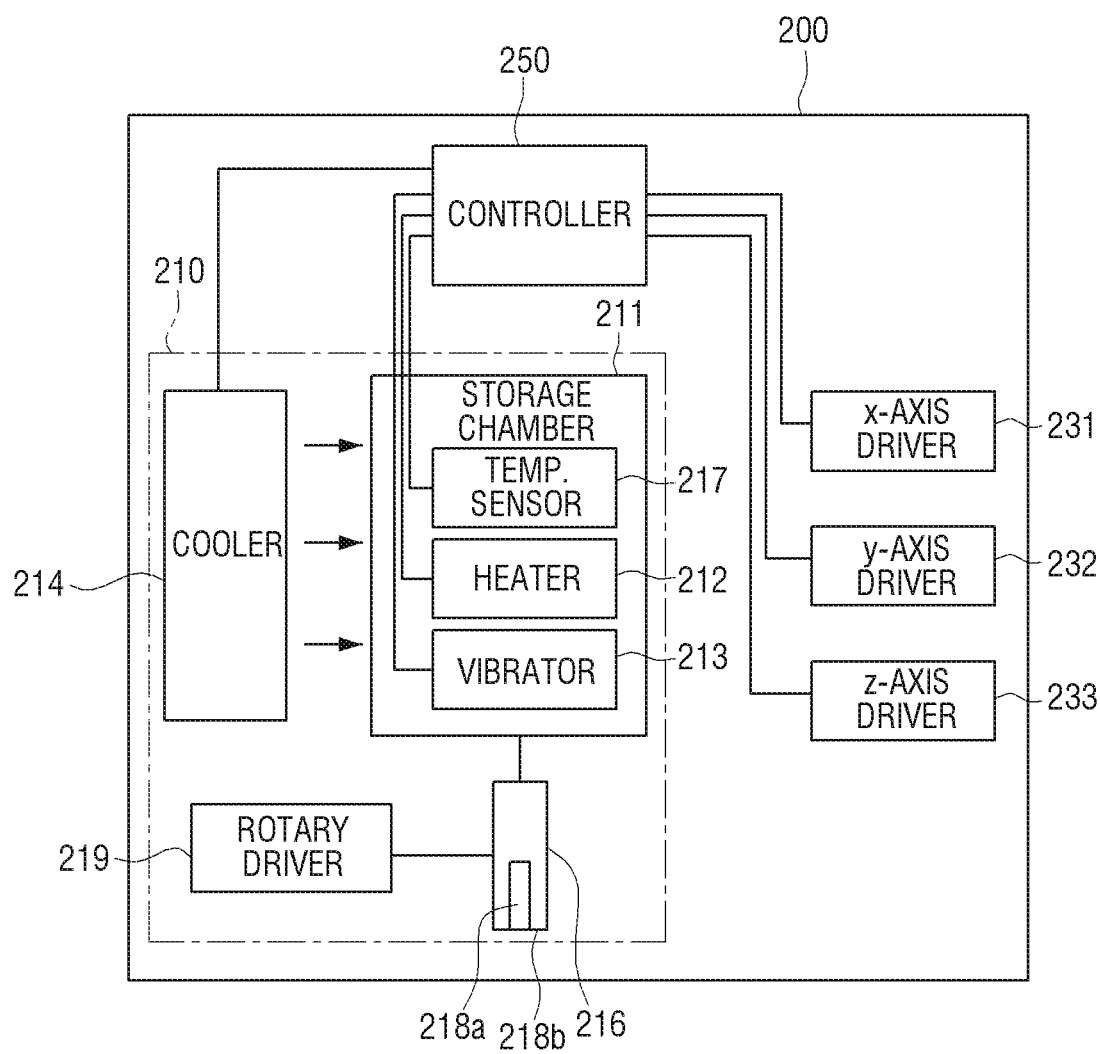
FIG. 4A is a schematic block diagram illustrating a material supply device for forming a shielding layer and an insulating layer of a circuit element package, according to an exemplary embodiment.

FIG. 4A is a schematic block diagram illustrating a material supply device 200 for forming a shielding layer and an insulating layer of a circuit element package, according to an exemplary embodiment. The material supply device 200 may be a 3D printer.

The material supply device 200 to be described hereinafter includes one dispenser 210 and one nozzle 216 provided on the dispenser 210, but is not limited thereto. A plurality of dispensers may be provided in the material supply device 200. Dispensers for forming the shielding layer and the insulating layer may be provided, dispensers for forming the side surface and the upper surface of the shielding layer may be provided, and dispensers for forming the side surface and the upper surface of the insulating layer may be provided, respectively.

Referring to FIG. 4A, the material supply device 200 includes the dispenser 210 configured to store and discharge the material, and an X-axis driver 231, a Y-axis driver 232, and a Z-axis driver 233 configured to move the dispenser 210 in the directions of X, Y, and Z-axes. Further, the material supply device 200 includes a controller 250 configured to control the dispenser 210, the X-axis driver 231, the Y-axis driver 232, and the Z-axis driver 233.

The dispenser 210 includes a storage chamber 211 in which the material is stored, a heater 212 configured to control the viscosity of the material, a vibrator 213, a cooler 214, and a temperature sensor 217. The heater 212, the vibrator 213, and the temperature sensor 217 may be arranged in predetermined positions inside the storage chamber 211. The cooler 214 may be arranged in a position that is adjacent to the storage chamber 211 outside the storage chamber 211. The cooler 214 may be a cooling fan that blows a cooled air toward the storage chamber 211, or a cooling pipe in which cooling water flows. Further, the dispenser 210 includes nozzle 216 configured to discharge the material that is supplied from the storage chamber 211 to the outside.

In an exemplary embodiment, to form the first and second shielding layers 120 and 140 and the insulating layer 130 with a predetermined thickness or a uniform thickness, the amount of the material that is supplied from the storage chamber 211 to the nozzle 216 may be kept constant. In this case, because the supply amount of the material is affected by the density, viscosity, and surface tension of the material, such physical property values are controlled. In an exemplary embodiment, to control the physical property values of the material, the controller 250 may change the temperature of the material through driving of the heater 212 and the cooler 214, and may vary or maintain a desired viscosity of the material through determination of the temperature value of the material that is detected by the temperature sensor 217.

Further, the viscosity of the material may be artificially controlled through application of a shear stress to the material using the thixotropy of the material. To control the shear stress of the material in real time, a desired viscosity can be maintained through adjustment of the frequency and the amplitude of the vibrator 213 arranged in the storage chamber 211. As described above, in the case of using the same material, the formation efficiency can be heightened by differently controlling the viscosity of the material. For example, to improve the formation speed in the case in which the first shielding layer 120 is formed in a high aspect ratio r, the material has high viscosity (about 200,000 cP). Unlike this, in the case of forming the second shielding layer 140 that has a larger area than the area of the first shielding layer 120, the material is injected by moving the dispenser 210 at high speed. In this case, the material that fills between the first shielding layer 120 that is pre-provided to form the side surface of the shielding layer, the semiconductor chip 115, and the passive elements 117 and 119 has low viscosity (about 4,000 cP) and thus has high fluidity.

Accordingly, in an exemplary embodiment, in the case of forming the second shielding layer 140 that forms the upper surface of the shielding layer, the viscosity may be lowered through application of the shear stress to the material through the vibrator 214. On the other hand, in the case of mixing a large amount of solvent to obtain a low-viscosity material during forming of the second shielding layer, the dispersion stability of the metal filler deteriorates, and it is difficult to obtain uniform shielding performance during curing. Accordingly, the same material viscosity control using the thixotropy of the material is a technology that is used for high-speed formation.

As described above, in an exemplary embodiment, the viscosity of the same material stored in the storage chamber 211 can be varied through control of the temperature and thixotropy of the material without replacing and filling different materials by viscosities in the storage chamber 211, and thus the supply amount and the viscosity of the material can be precisely controlled.

Further, the dispenser 210 is connected to a rotary driver 219 that can rotate the nozzle 216 in forward and reverse directions around a center shaft of the nozzle 216. The rotary driver 219 can transfer a rotating force to the nozzle 216 through a power transfer method. The controller 250 may move the nozzle 216 in a linear direction along a formation path P (of FIG. 4B) of the first shielding layer 120, and then may rotate the nozzle 216 at about 90° through the rotary driver 219 at a corner portion of the formation path P of the first shielding layer 120. Accordingly, the material can be continuously discharged from the dispenser 210.

Further, the rotary driver 210 may rotate the storage chamber 211 through the power transfer method, and in this case, the nozzle 216 may be fixedly installed at a lower end of the storage chamber 211.

Figure 4B:
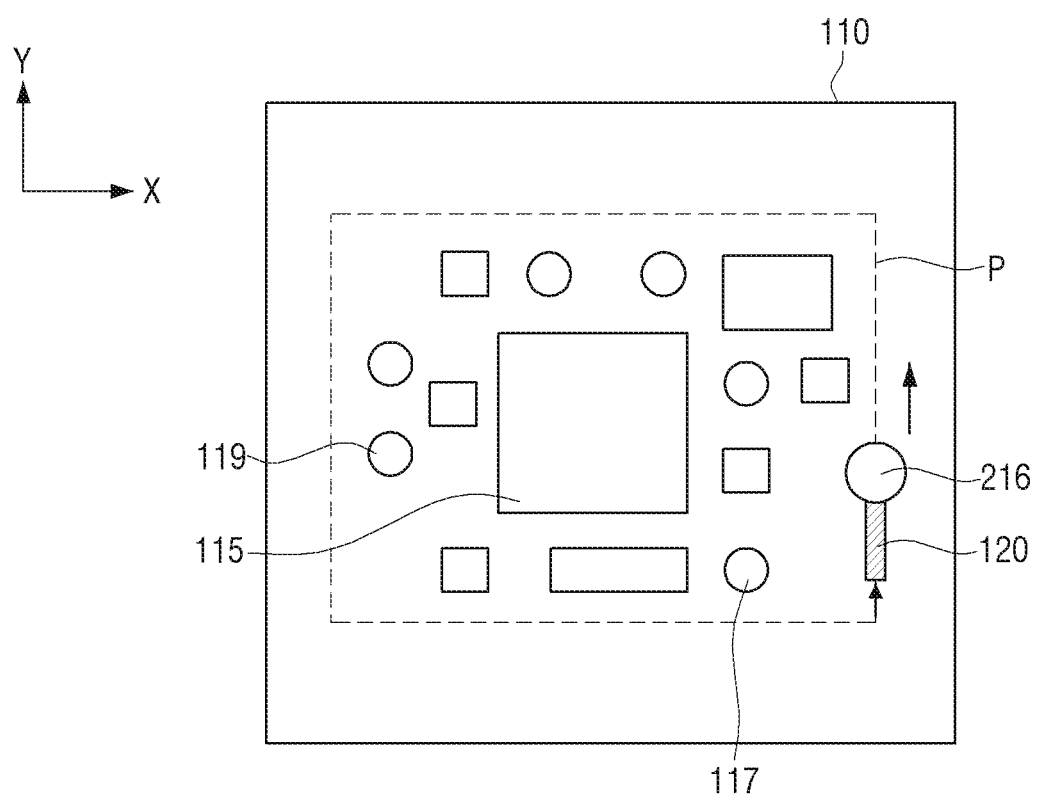
FIG. 4B is a plan view illustrating a path through which a nozzle moves to form a first shielding layer, according to an exemplary embodiment.

FIG. 4B is a plan view illustrating a path through which the nozzle 216 moves to form the first shielding layer 120, according to an exemplary embodiment.

Referring to FIG. 4B, the formation path P of the first shielding layer 120 forms a closed loop to surround the semiconductor chip 115 and the passive elements 117 and 119 to be shielded. In this case, the formation path P of the first shielding layer 120 is in a rectangular shape.

Figure 5:
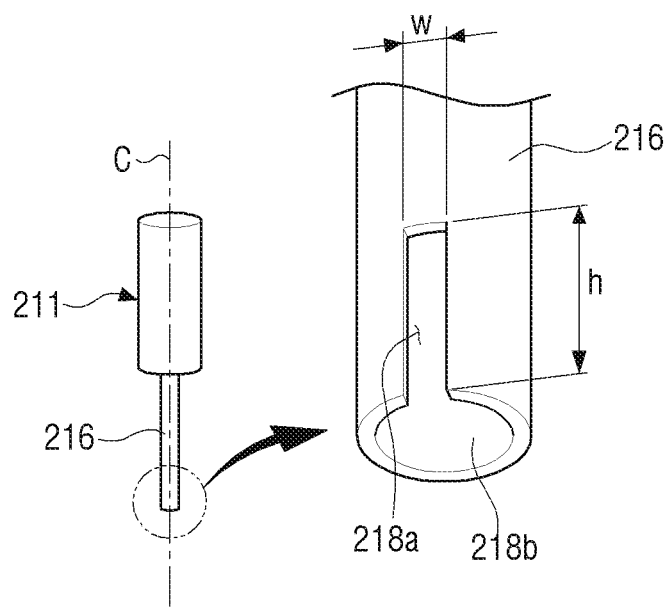
FIG. 5 is a view illustrating a discharge port through which a material for forming a first shielding layer is discharged through the nozzle illustrated in FIG. 4B.

FIG. 5 is a view illustrating a discharge port through which a material for forming a first shielding layer is discharged through the nozzle 216 illustrated in FIG. 4B.

Referring to FIGS. 4A and 5, the nozzle 216 includes a first discharge port 218a formed on a side surface of a lower portion of the nozzle 216 to discharge the material, and a second discharge port 218b formed on a bottom surface thereof to discharge the material. The first and second discharge ports 218a and 218b communicate with each other.

As described above, the first discharge port 218a is asymmetrically formed about the center shaft C of the nozzle 216. Further, the first discharge port 218a may be in a rectangular shape that is similar to the final cross section of the first shielding layer 120 to form the first shielding layer 120 having a high aspect ratio.

In an exemplary embodiment, the first discharge port 218a may be used at a numerical value that indicates a value that is obtained by dividing the height h of the first discharge port 218a by the width w of the first discharge port 218a. That is, in an exemplary embodiment, the aspect ratio r of the first discharge port 218a may be represented by the following equation 1.

$$\text{Aspect ratio } r = h/w \qquad \text{[Equation 1]}$$

Through such a shape of the first discharge port 218a, the first shielding layer 120 has a high aspect ratio structure in which the thickness thereof is thin and the height thereof is high.

On the other hand, as moving along the predetermined path P (of FIG. 4B), the nozzle 216 may discharge the material simultaneously to a point that is adjacent to the semiconductor chip 115 and/or the passive elements 117 and 119 (in the case of shielding the semiconductor chip 115 only, the side wall of the semiconductor chip 115) and the upper surface of the printed circuit board 110 through the first and second discharge ports 218a and 218b to form the first shielding layer 120.

Figure 6:
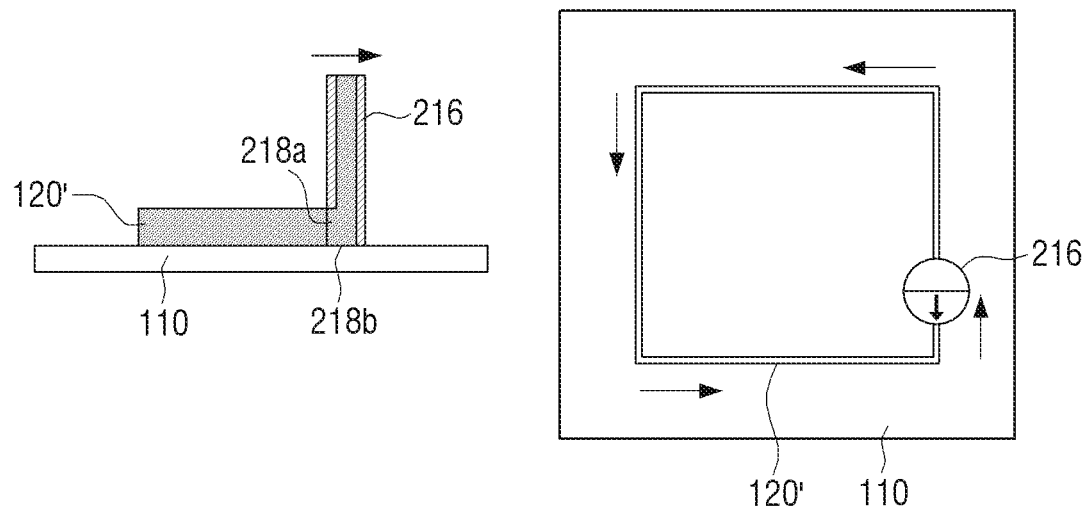
FIG. 6 is a view illustrating a process of forming a first shielding layer by twice moving a nozzle along a path to highly form the first shielding layer, according to an exemplary embodiment.
Figure 6:
Figure 6:
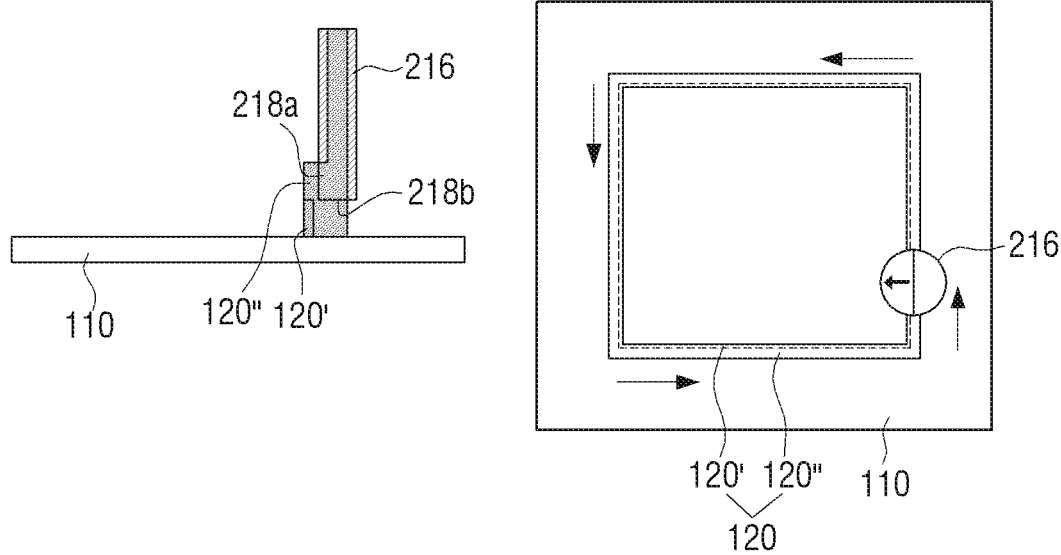

FIG. 6 is a view illustrating a process of forming the first shielding layer 120 by twice moving the nozzle 216 along a path to highly form the first shielding layer 120, according to an exemplary embodiment.

Referring to portion (a) of FIG. 6, as moving along the first shielding layer forming path P (of FIG. 4B), the nozzle 216 discharges the material through the first and second discharge ports 218a and 218b. Accordingly, a lower portion 120' of the first shielding layer 120 may be formed. In this case, the first discharge port 218a is arranged toward an opposite direction to the moving direction of the nozzle 216.

Referring to portion (b) of FIG. 6, after the height of the nozzle 216 is upwardly adjusted, the nozzle 216 discharges the material through the first and second discharge ports 218a and 218b as moving along the upper portion of the first shielding layer 120 so that an upper portion 120" of the first shielding layer is formed on the basis of the lower portion 120' of the first shielding layer 120.

In this case, the first discharge port 218a is arranged in a direction that is perpendicular to the moving direction of the nozzle 216 so that the first discharge port 218a is directed toward the lower portion 210' of the first shielding layer 120. Accordingly, the material that is discharged to the first discharge port 218a is formed on an upper surface of the lower portion 120' of the first shielding layer 120, and the material that is discharged to the second discharge port 218b is formed to cover an outer surface of the lower portion 120' of the first shielding layer 120. The discharge amount of the material for forming the upper portion 120" of the first shielding layer 120 is larger than the discharge amount of the material for forming the lower portion 120' of the first shielding layer 120.

Figure 7:
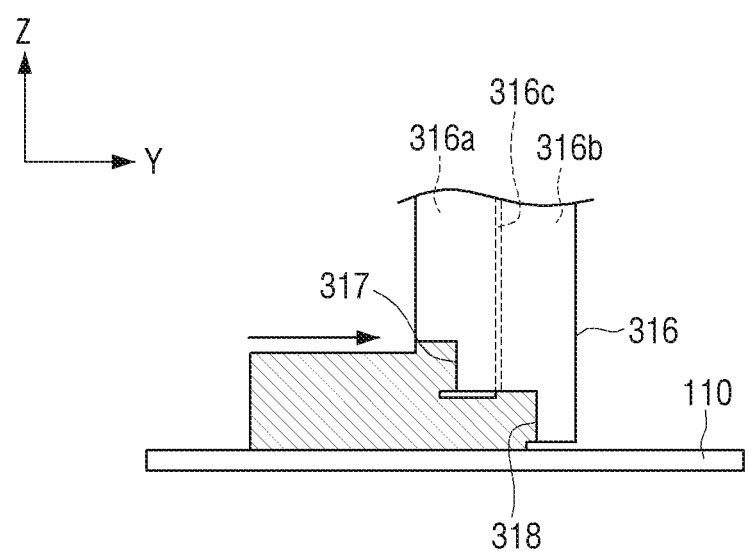
FIG. 7 is a view illustrating a discharge port formed on a nozzle in upward and downward directions, according to an exemplary embodiment.

FIG. 7 is a view illustrating a discharge port formed on a nozzle 316 in upward and downward directions, according to an exemplary embodiment.

Referring to FIG. 7, the nozzle 316 may be formed to include two discharge ports 317 and 318 on upper and lower portions of the discharge port. The upper discharge port 317 and the lower discharge port 318 respectively communicate with first and second material supply paths 316a and 316b that are separated from each other by a partition 316c. The upper discharge port 317 and the lower discharge port 318 may be formed to have the same width, or the width of the lower discharge port 318 is larger than the width of the upper discharge port 317. Further, the upper discharge port 317 and the lower discharge port 318 may be formed to have the same height, or the upper discharge port 317 and the lower discharge port 318 are formed to have different heights.

As described above, in the case in which the nozzle 316 includes the upper and lower discharge ports 317 and 318, the material may be discharged from the upper and lower discharge ports 317 and 318 simultaneously or with a time difference between them. For example, the lower discharge port 318 is arranged more forward than the upper discharge port 317 in the moving direction of the nozzle, and in this case, the material that is discharged from the upper discharge port 317 is formed on an upper side of the material that is earlier discharged from the lower discharge port 318. For this, at a start time to form the first shielding layer 120, the nozzle 316 discharges the material through the lower discharge port 318 simultaneously with moving along the formation path of the first shielding layer 120, and with a time difference from the time to discharge the material through the lower discharge port 318, the nozzle 316 discharges the material through the upper discharge port 317.

As described above, in an exemplary embodiment, the nozzle 316 discharges the material simultaneously through the upper and lower discharge ports 317 and 318 as once moving along the predetermined formation path P (of FIG. 4B) of the first shielding layer 120, thereby forming the first shielding layer 120 having the high aspect ratio r.

In an exemplary embodiment, two upper and lower discharge ports 317 and 318 are provided on the upper and lower portions of the nozzle 316, but are not limited thereto. Three or more discharge ports are provided in upward and downward directions. In this case, the number of divided discharge ports may be set in consideration of both the discharge flow rate and the viscosity of the material so that the formed first shielding layer 120 can maintain its height.

Figure 8:
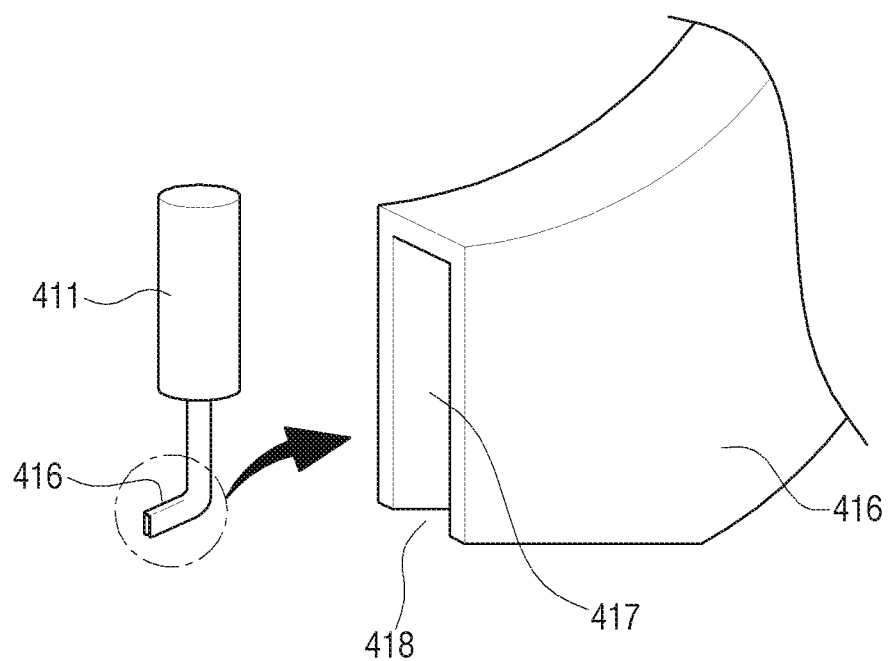
FIG. 8 is a view illustrating a lower end portion of a nozzle that is bent substantially in a horizontal direction, according to an exemplary embodiment.

FIG. 8 is a view illustrating a lower end portion of a nozzle 416 that is bent substantially in a horizontal direction, according to an exemplary embodiment.

Referring to FIG. 8, a lower end portion of the nozzle 416 that is formed at a lower end of a storage chamber 411 is bent substantially in a horizontal direction. In this case, a first discharge port 417 is formed at the bent end portion of the nozzle 416, and a second discharge port 418 that communicates with the first discharge port 417 is formed on the lower side of the first discharge port 417. In the same manner as the first discharge port 218a of the nozzle 216 as described above, the first discharge port 417 is formed with the high aspect ratio r of the width w and the height h.

Figure 9:
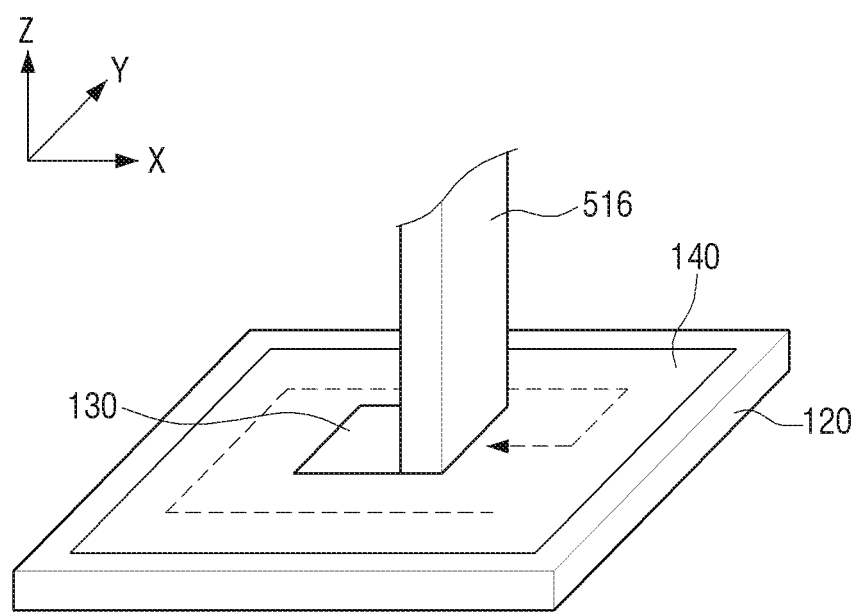
FIG. 9 is a view illustrating a state in which a second shielding layer is formed through a nozzle, according to an exemplary embodiment.

FIG. 9 is a view illustrating a state in which the second shielding layer 140 is formed through a nozzle 516, according to an exemplary embodiment.

Referring to FIG. 9, a low-viscosity material may be used to form a film with a predetermined thickness as increasing the supply amount of the material when the second shielding layer 140 is formed on the upper surface of the insulating layer 130. The nozzle 516 has a flat lower end. Further, the nozzle 516 may move from the outline of the upper surface of the insulating layer 130 toward the center thereof substantially in a spiral direction, and thus the second shielding layer 140 can be formed at high speed.

Figure 10:
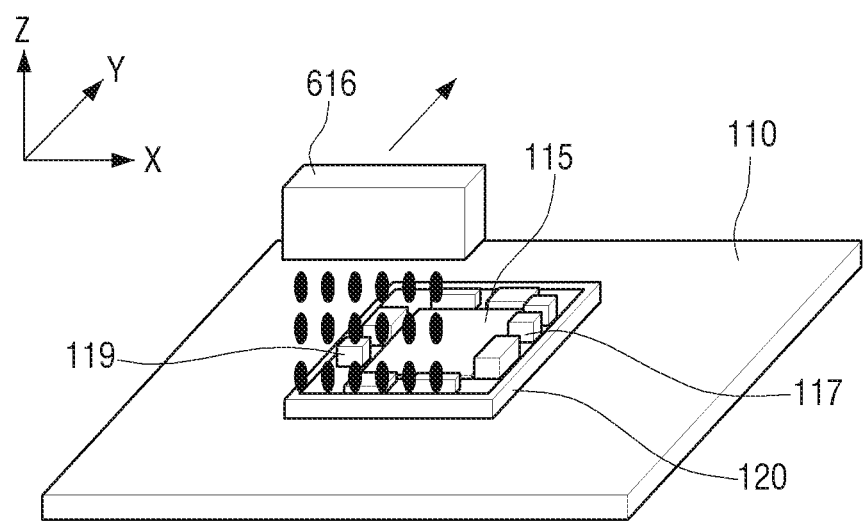
FIG. 10 is a view illustrating a process of forming an insulating layer in a jetting method, according to an exemplary embodiment.

FIG. 10 is a view illustrating a process of forming the insulating layer 130 a jetting method, according to an exemplary embodiment.

Referring to FIG. 10, to conformally coat the surfaces of passive elements 117 and 119 having various heights, a material that is composed of low-viscosity insulating ink may be used. In this case, a nozzle 616 has a structure that selects a region (e.g., shielding region partitioned by the first shielding layer 120 that is in a dam shape) and discharges the insulating ink in the jetting method.

The insulating ink may be properly limited in ink viscosity, surface tension, and wetting degree to conformally form the surface of the insulating layer 130. Further, solventless type insulating ink may be used to prevent the surfaces (upper end surfaces) of the passive elements 117 and 119 from being exposed due to the thickness reduction caused by the curing and to prevent cracks from occurring due to the trapped solvent. In addition, a UV curing process or a curing process in which UV and heat are simultaneously applied may be performed to make it possible to rapidly cure the insulating layer 130 that is injected by the jetting.

Figure 11:
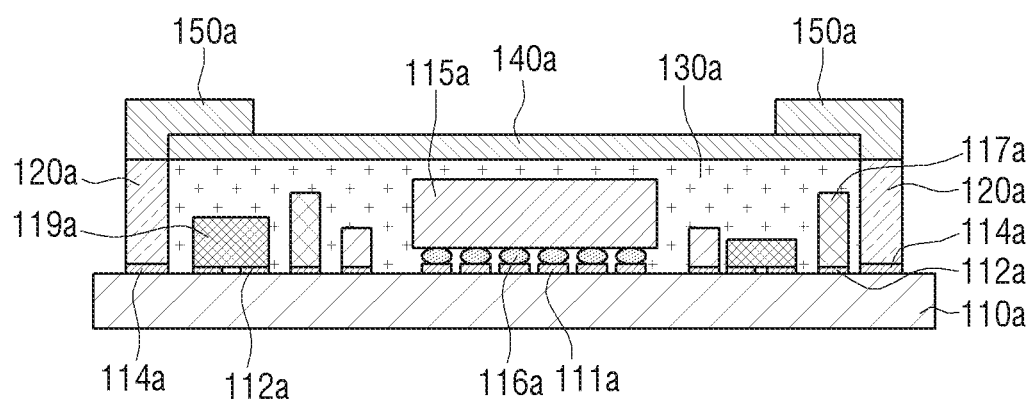
FIG. 11 is a cross-sectional view illustrating a circuit element package according to another exemplary embodiment.

FIG. 11 is a cross-sectional view illustrating a circuit element package 100a according to another exemplary embodiment.

Referring to FIG. 11, the circuit element package 100a includes a printed circuit board 110a, a semiconductor chip 115a mounted on the printed circuit board 110a, and passive elements 117a and 119a. On an upper surface of the printed circuit board 110a, a first connection pad 111a and a second connection pad 112a are patterned to electrically connect the semiconductor chip 115a and the passive elements 117a and 119a to the printed circuit board 110a. A plurality of first and second connection pads 111a and 112a are provided. The first and second connection pads 111a and 112a may be formed for grounding or signal transfer of the semiconductor chip 115a and the passive elements 117a and 119a.

A ground pad 114a is patterned on an upper surface of the printed circuit board 110a. The ground pad 114a may be formed for grounding or signal transfer of the semiconductor chip 115a and the passive elements 117a and 119a. The ground pad 114a is grounded to a first shielding layer 120a.

The semiconductor chip 115a includes a plurality of connection terminals 116a that are electrically connected to the first connection pads 111a of the printed circuit board 110a. The plurality of connection terminals 116a may be formed, for example, in a BGA method to be solder balls, and may be referred to as a BGA 116a.

The passive elements 117a and 119a (e.g., resistors, capacitors, and inductors) may include at least one connection terminal that is electrically connected to the second connection pad 112a of the printed circuit board 110a. The height of the passive elements 117a and 119a that are mounted on the printed circuit board 110a may be lower or higher than the height of the semiconductor chip 115a, and the semiconductor chip 115a and the passive elements 117a and 119a are covered by an insulating layer 130a to be isolated from the first shielding layer 120a.

The circuit element package 100a includes the first shielding layer 120a, the insulating layer 130a, a second shielding layer 140a, and an edge bridge 150a on the printed circuit board 110a.

The first and second shielding layers 120a and 140a may be formed of a material having electromagnetic shielding characteristics, and the first and second shielding layers 120a and 140a can prevent the electromagnetic waves that are unavoidably generated during an operation process of the circuit element package 100 from exerting an influence on an outside.

The first and second shielding layers 120a and 140a cover the insulating layer 130a. The first shielding layer 120a is connected to the ground pad 114a, and may be in a closed loop shape to surround the semiconductor chip 115a and the passive elements 117a and 119a.

The insulating layer 130a is formed inside the first and second shielding layers 120a and 140a, and covers the semiconductor chip 115a and the passive elements 117a and 119a. The insulating layer 130a may isolate the semiconductor chip 115a and the passive elements 117a and 119a from the first and second shielding layers 120a and 140a.

The insulating layer 130a may be made of a material having fluidity so that it is injected into a region that is partitioned by the first shielding layer 120a in a dam shape and comes in close contact with the outsides of the semiconductor chip 115a and the passive elements 117a and 119a. Further, the insulating layer 130a may isolate the connection pad 112a (one among the connection pads 111a and 112a) that is arranged in the outermost portion and the ground pad 114a from each other. The insulating layer 130a that is injected into a partition region of the first shielding layer 120a may be cured in a predetermined shape through a curing process, such as ambient curing, thermal curing, or UV curing. The insulating layer 130a may be formed using a thixotropic material or a hot melt material. Further, the first shielding layer 120a and the edge bridge 150a may also be formed using the thixotropic material or hot melt material.

The second shielding layer 140a may be laminated and formed on the upper surface of the cured insulating layer 130a. The second shielding layer 140a may be a shielding film having electromagnetic shielding characteristics. The shielding film has a predetermined thickness and may be attached to the upper surface of the insulating layer 130a.

The edge bridge 150a is formed to cover the boundary between the first shielding layer 120a and the second shielding layer 140a and the periphery thereof. For example, the edge bridge 150a may be formed to be bent at about 90° so that the edge bridge 150a is laminated on the upper surface of the first shielding layer 120a and covers the peripheral portion of the second shielding layer 140a. As described above, because the edge bridge 150a connects the first and second shielding layers 120a and 140a to each other, the ground region can be extended from the first shielding layer 120a to the second shielding layer 140a.

Figure 12:
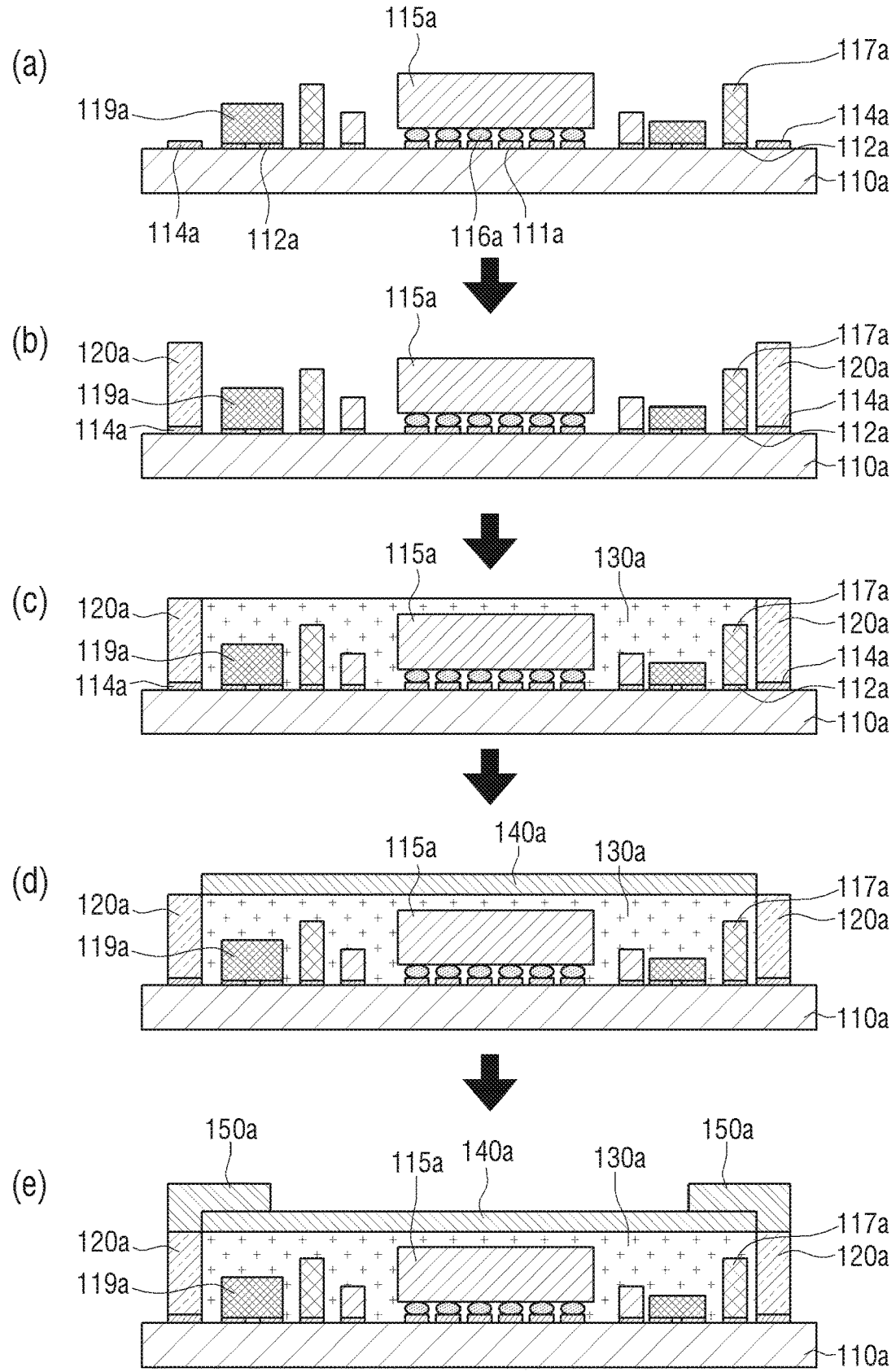
FIG. 12 is a cross-sectional view successively illustrating a process of manufacturing the circuit element package of FIG. 11, according to another exemplary embodiment.

FIG. 12 is a cross-sectional view successively illustrating a process of manufacturing the circuit element package 100a of FIG. 11, according to another exemplary embodiment.

Referring to portion (a) of FIG. 12, the connection pads 111a and 112a and the ground pad 114a are patterned on the upper surface of the printed circuit board 110a, and then the semiconductor chip 115a and the passive elements 117a and 119a are bonded to the connection pads 111a and 112a so that the semiconductor chip 115a and the passive elements 117a and 119a are electrically connected to the connection pads 111a and 112a.

Referring to portion (b) of FIG. 12, the first shielding layer 120a is formed on the upper surface of the printed circuit board 110a to be connected to the ground pad 114a. The first shielding layer 120a may be substantially in a closed loop shape to surround the semiconductor chip 115a and the passive elements 117a and 119a.

Referring to portion (c) of FIG. 12, the insulating layer 130a is formed on the inside of the first shielding layer 120a that is formed substantially in a dam shape. The material that forms the insulating layer 130a may have lower viscosity than the viscosity of the material of the first shielding layer 120a so that the material of the insulating layer 130a has higher fluidity than the fluidity of the material that forms the first shielding layer 120a. The material that forms the insulating layer 130a secures high fluidity, and may fill between the semiconductor chip 115a and the passive elements 117a and 119a and the upper surface of the printed circuit board 110a when the material of the insulating layer 130a is injected into the shielding region that is partitioned by the first shielding layer 120a. The fluid material that is injected with a predetermined height is cured through the ambient curing, UV curing, or thermal curing process.

Referring to portion (d) of FIG. 12, the second shielding layer 140a is formed on the upper surface of the cured insulating layer 130a. The second shielding layer 140a may be a shielding film having a predetermined thickness, and may have an area that is substantially equal to or somewhat larger than the upper surface of the insulating layer 130a. In this case, because adhesives are spread on the bottom surface of the second shielding layer 140a, the second shielding layer 140a may be attached to the upper surface of the insulating layer 130a.

Referring to portion (e) of FIG. 12, the edge bridge 150a is formed to simultaneously overlap the upper surfaces of the first shielding layer 120a and the second shielding layer 140a. The edge bridge 150a may fill a gap between the first and second shielding layers 120a and 140a, and may electrically connect the upper surface of the first shielding layer 120a and the peripheral portion of the second shielding layer 140a to each other. In this case, because the first shielding layer 120a that is connected to the ground pad 114a is electrically connected to the second shielding layer 140a through the edge bridge 150a, the ground region can be extended up to the upper surface of the second shielding layer 140a, and thus a stable ground path can be provided.

Figure 13:
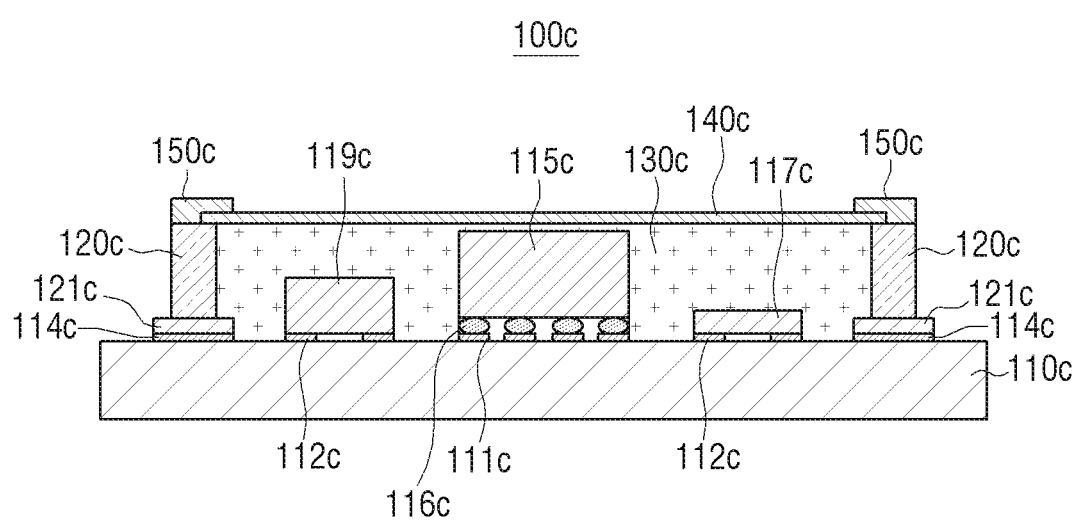
FIG. 13 is a cross-sectional view illustrating a circuit element package according to still another exemplary embodiment.

FIG. 13 is a cross-sectional view illustrating a circuit element package 100c according to still another exemplary embodiment.

Referring to FIG. 13, in the circuit element package 100c, first and second connection pads 111c and 112c and a ground pad 114c are patterned on a printed circuit board 110c.

A semiconductor chip 115c includes a plurality of connection terminals 116c that are electrically connected to the first connection pads 111c of the printed circuit board 110c. Passive elements 117c and 119c may include at least one connection terminal that is electrically connected to the second connection pad 112c of the printed circuit board 110c. The semiconductor chip 115c and the passive elements 117c and 119c are covered by an insulating layer 130c to be isolated from a first shielding layer 120c.

On an upper surface of the ground pad 114c, a skirt portion 121c that supports the first shielding layer 120c is formed to increase the height of the first shielding layer 120c. Because the skirt portion 121c is provided, the first shielding layer 120c secures a structural stability. Further, because the height of the first shielding layer 120c is increased, the injection process of the insulating layer 130 can be facilitated, and the thickness control of the overall shielding structure can be facilitated. In this case, the skirt portion 121c may be made of the same material as the material of the first shielding layer 120c.

The first shielding layer 120c is formed on an upper surface of the skirt portion 121c, and the insulating layer 130c is formed in a region that is partitioned by the first shielding layer 120c. The insulating layer 130c may be cured after injection of a material of the insulating layer 130c.

A second shielding layer 140c is formed on the upper surface of the insulating layer 120c. The second shielding layer 140c has an area that covers the whole upper surface of the insulating layer 130c and a part of the first shielding layer 120c.

An edge bridge 150c is formed on a part of an upper surface of the first shielding layer 120c that is not occupied by the second shielding layer 140c and a peripheral portion of an upper surface of the second shielding layer 140c. The edge bridge 150c may be made of the same material as the material of the first shielding layer 120c. A ground path is extended to the second shielding layer 140c having an area that is larger than the area of the first shielding layer 120c through the edge bridge 150c to secure electrical stability.

Figure 14:
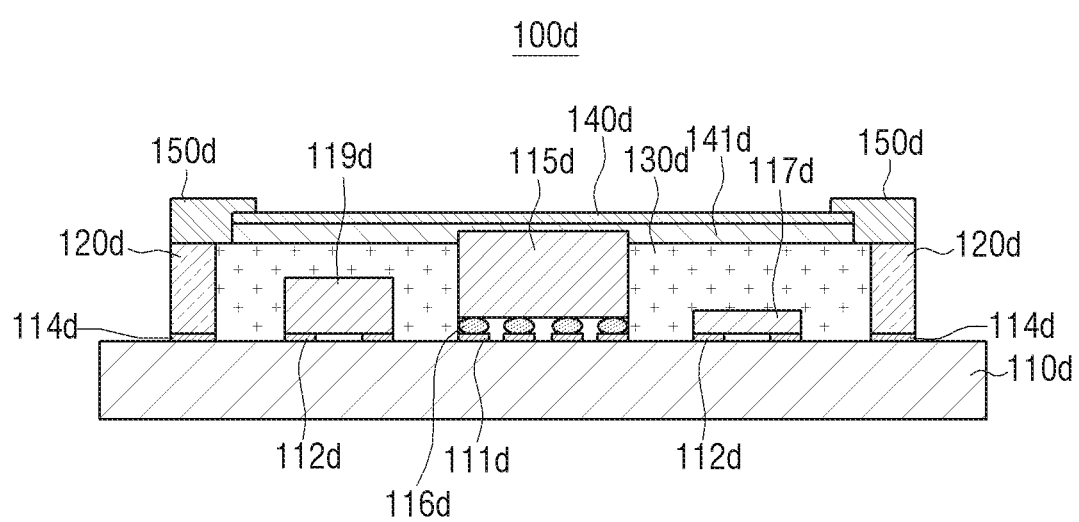
FIG. 14 is a cross-sectional view illustrating a circuit element package according to still another exemplary embodiment.

FIG. 14 is a cross-sectional view illustrating a circuit element package 100d according to still another exemplary embodiment.

Referring to FIG. 14, in the circuit element package 100d, first and second connection pads 111d and 112d and a ground pad 114d are patterned on a printed circuit board 110d.

A semiconductor chip 115d includes a plurality of connection terminals 116d that are electrically connected to the first connection pads 111d of the printed circuit board 110d. Passive elements 117d and 119d may include at least one connection terminal that is electrically connected to the second connection pad 112d of the printed circuit board 110d. The semiconductor chip 115d and the passive elements 117d and 119d are covered by an insulating layer 130d to be isolated from a first shielding layer 120d.

On an upper surface of the ground pad 114d, a first shielding layer 120d is formed, and the insulating layer 130d is formed in a region that is partitioned by the first shielding layer 120d. The insulating layer 130d may be cured after injection of a material of the insulating layer 130d. In this case, if the height of the first shielding layer 120d is low, the height of the insulating layer 130d may also become low, and due to this, upper ends of the semiconductor chip 115d or the passive elements 117d and 119d having high height may be exposed to project from the upper surface of the insulating layer 130d. In this case, an insulating adhesive layer 141d is formed on an upper surface of the insulating layer 130d so that the semiconductor chip 115d that is exposed from the insulating layer 130d and a second shielding layer 140d are kept in an isolation state from each other. In this case, the second shielding layer 130d may be a shielding film.

Accordingly, even in the case in which the height of the insulating layer 130d is limited due to the low height of the first shielding layer 120d and thus the semiconductor chip 115d or the passive elements 117d and 119d are exposed to an outside of the insulating layer 130d, the semiconductor chip 115d or the passive elements 117d and 119d can be prevented from being short-circuited to the second shielding layer 140d by the insulating adhesive layer 141d.

An edge bridge 150d covers the upper surface of the first shielding layer 120d, a peripheral portion of the upper surface of the insulating layer 130d, and the upper surface of the second shielding layer 140d. The edge bridge 150d may be made of the same material as the material of the first shielding layer 120d. A ground path is extended to the second shielding layer 140d having an area that is larger than the area of the first shielding layer 120d through the edge bridge 150d to secure electrical stability.

Figure 15:
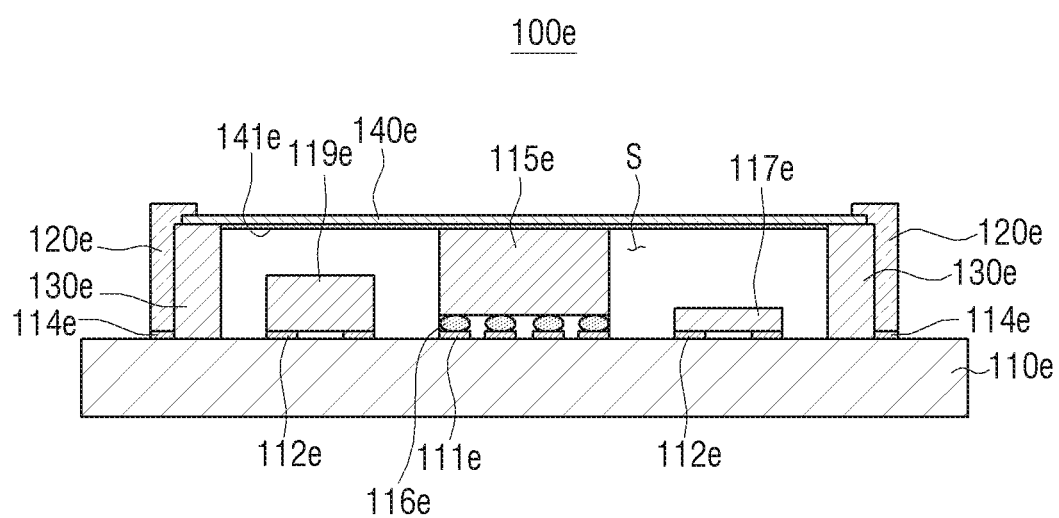
FIG. 15 is a cross-sectional view illustrating a circuit element package according to still another exemplary embodiment.

FIG. 15 is a cross-sectional view illustrating a circuit element package 100e according to still another exemplary embodiment.

Referring to FIG. 15, in the circuit element package 100e, first and second connection pads 111e and 112e and a ground pad 114e are patterned on a printed circuit board 110e.

A semiconductor chip 115e includes a plurality of connection terminals 116e that are electrically connected to the first connection pads 111e of the printed circuit board 110e. Passive elements 117e and 119e may include at least one connection terminal that is electrically connected to the second connection pad 112e of the printed circuit board 110e.

In the circuit element package 100e, an insulating layer 130e is formed before a first shielding layer 120e is formed. In the case in which the insulating layer 130e is first formed, the first shielding layer 120e can depend on the insulating layer 130e when the first shielding layer 120e is formed on the basis of the insulating layer 130e, and thus higher aspect ratio can be achieved in comparison to a case in which the first shielding layer 120e is singly formed.

The insulating layer 130e may be formed at a predetermined height, and may be formed on the printed circuit board 110e to form a closed curve substantially in a dam shape. In this case, a predetermined space S is formed inside the insulating layer 130e.

A peripheral portion of a bottom surface of a second shielding layer 140e is laminated on an upper surface of the insulating layer 130e, and an insulating film 141e is formed on a bottom surface of the second shielding layer 140e. In this case, the height of the insulating layer 130e may be lowered to minimize the space S, and in this case, the insulating film 141e may come in contact with the upper surface of the semiconductor chip 115e.

The first shielding layer 120e is formed to surround an outer surface of the insulating layer 130e, and an upper end of the first shielding layer 120e is formed to cover a peripheral portion of an upper surface of the second shielding layer 140e so that it can be connected to the second shielding layer 140e. Accordingly, a ground path is extended to the second shielding layer 140e having an area that is larger than the area of the first shielding layer 120e through an upper end portion of the first shielding layer 120e to secure electrical stability.

As described above, in the case of forming the first shielding layer 120e on the basis of the insulating layer 130e, a large amount (equal to or lower than 70%) of metal filler is contained in the material of the first shielding layer 120e, and thus it may be applied in the case in which the improvement of thixotropy is difficult. In this case, because the insulating layer 130e is in a dam shape, an injection process of an insulating material can be omitted. Accordingly, the process can be promptly performed, and material saving effects can be obtained.

Figure 16:
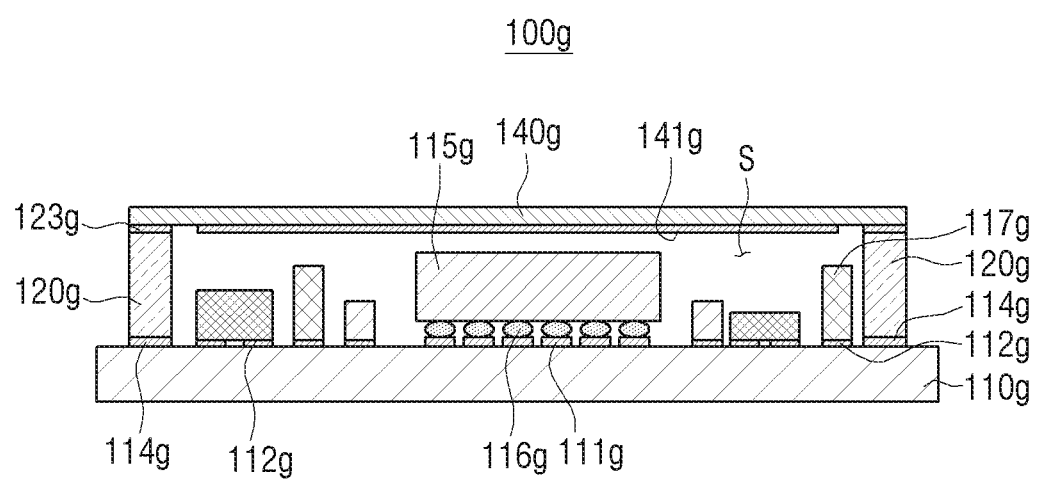
FIG. 16 is a cross-sectional view illustrating a circuit element package according to still another exemplary embodiment.

FIG. 16 is a cross-sectional view illustrating a circuit element package 100g according to still another exemplary embodiment.

Referring to FIG. 16, in the circuit element package 100g, first and second connection pads 111g and 112g and a ground pad 114g are patterned on a printed circuit board 110g.

A semiconductor chip 115g includes a plurality of connection terminals 116g that are electrically connected to the first connection pads 111g of the printed circuit board 110g. A passive element 117g may include at least one connection terminal that is electrically connected to the second connection pad 112g of the printed circuit board 110g. The semiconductor chip 115g and the passive element 117g may be isolated from first and second shielding layers 120g and 140g by a predetermined space S formed inside the first shielding layer 120g.

On an upper surface of the ground pad 114g, the first shielding layer 120g is formed. The second shielding layer 140g may be a shielding film, and an insulating film 141g and a conductive adhesive layer 123g that surrounds the insulating film 141g are formed on a bottom surface of the second shielding layer 140g. A ground path is extended to the second shielding layer 140g having an area that is larger than the area of the first shielding layer 120g through the conductive adhesive layer 123g to secure electrical stability.

When the second shielding layer 140g is attached to the upper surface of the first shielding layer 120g through the adhesive layer 123g, the insulating film 141g covers upper surfaces of the semiconductor chip 115g and the passive element 117g. Accordingly, the insulating film 141g can prevent the second shielding layer 140g from being short-circuited to the semiconductor chip 115g and the passive element 117g.

In this case, because a separate insulating layer except for the insulating film 141g can be omitted, the process can be promptly performed, and material saving effects can be obtained.

Figure 17:
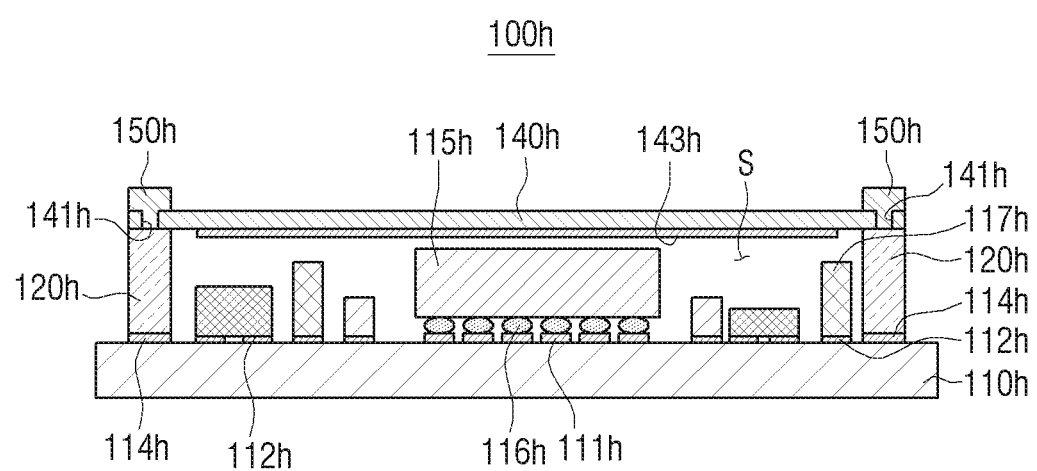
FIG. 17 is a cross-sectional view illustrating a circuit element package according to still another exemplary embodiment.
Figure 18A:
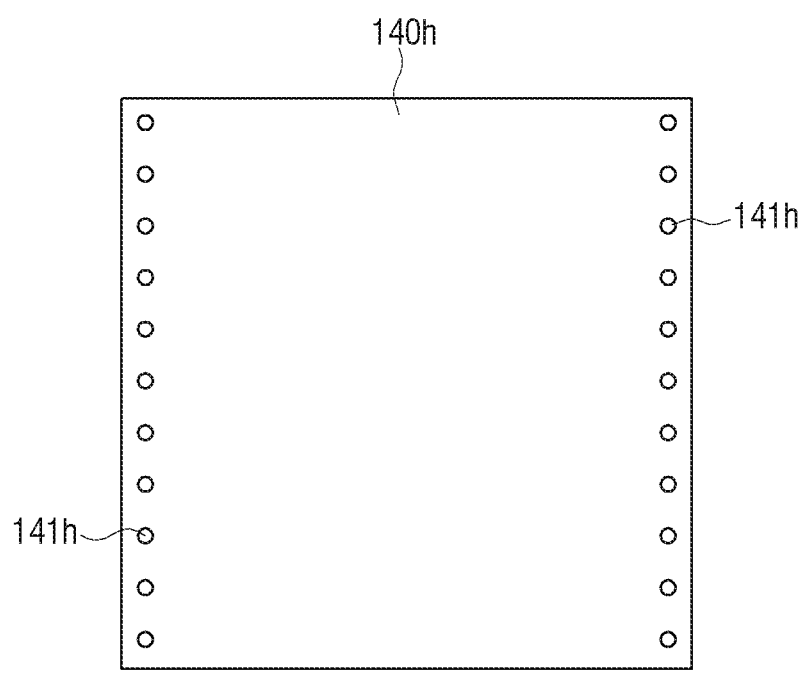
FIGS. 18A and 18B are plan views illustrating a second shielding layer according to exemplary embodiments.
Figure 18B:
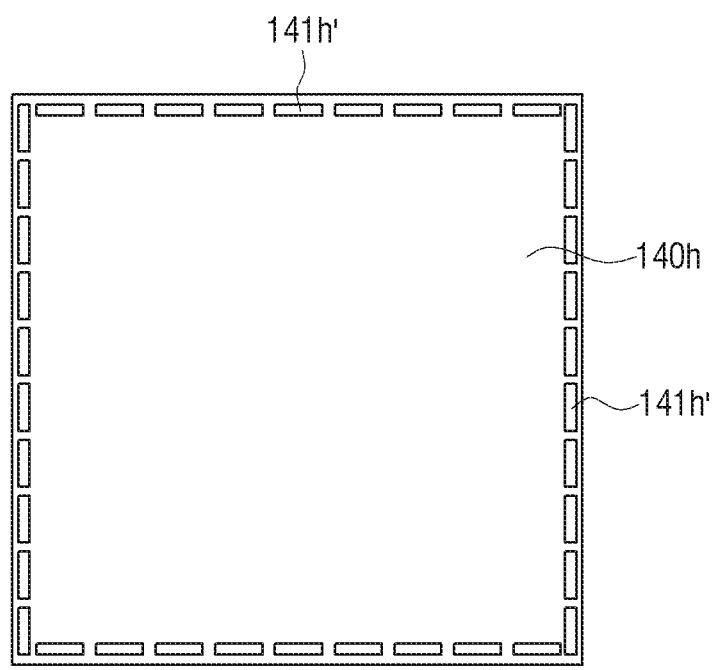

FIG. 17 is a cross-sectional view illustrating a circuit element package 100h according to still another exemplary embodiment, and FIGS. 18A and 18B are plan views illustrating a second shielding layer 140h according to exemplary embodiments.

Referring to FIG. 17, in the circuit element package 100h, first and second connection pads 111h and 112h and a ground pad 114h are patterned on a printed circuit board 110h.

A semiconductor chip 115h includes a plurality of connection terminals 116h that are electrically connected to the first connection pads 111h of the printed circuit board 110h. A passive element 117h may include at least one connection terminal that is electrically connected to the second connection pad 112h of the printed circuit board 110h. The semiconductor chip 115h and the passive element 117h may be isolated from first and second shielding layers 120h and 140h by a predetermined space S formed inside the first shielding layer 120h.

On an upper surface of the ground pad 114h, the first shielding layer 120h is formed. The second shielding layer 140h may be a shielding film, and an insulating film 143h is formed on a bottom surface of the second shielding layer 140h. When the second shielding layer 140h is attached to the upper surface of the first shielding layer 120h through a connection layer 150h, the insulating film 143h covers upper surfaces of the semiconductor chip 115h and the passive element 117h. Accordingly, the insulating film 143h can prevent the second shielding layer 140h from being short-circuited to the semiconductor chip 115h and the passive element 117h.

Referring to FIG. 18A, a plurality of through-holes 141h are formed at predetermined intervals along peripheral portions of both sides thereof. The peripheral portions of both sides of the second shielding layer 140h may be seated on the upper surface of the first shielding layer 120h, and the connection layer 150h that is made of a conductive shielding material, such as an edge bridge, may be formed along the peripheral portion of the upper surface of the second shielding layer 140h. In this case, the connection layer 150h that is spread on the first shielding layer 140h may flow into the plurality of through-holes 141h to electrically connect the first and second shielding layers 120h and 140h to each other. Accordingly, a ground path is extended to the second shielding layer 140h having an area that is larger than the area of the first shielding layer 120h through the connection layer 141h to secure electrical stability.

Referring to FIG. 18B, a plurality of through-holes 141h' are formed at predetermined intervals along four sides of the second shielding layer 140h. In the case in which the second shielding layer has four or more sides, the plurality of through-holes may be formed to correspond to the respective sides.

Figure 19:
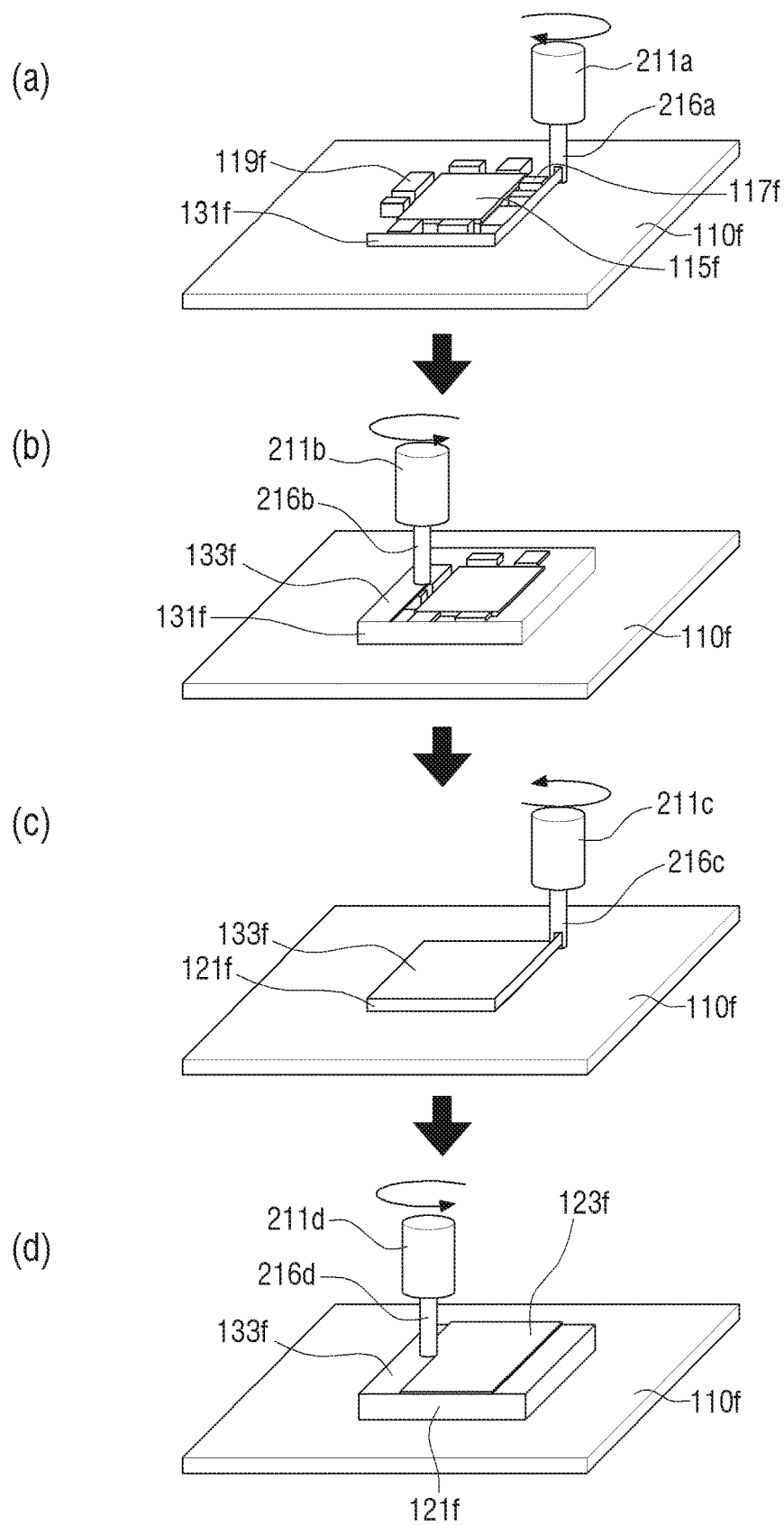
FIG. 19 is a view successively illustrating a process of manufacturing a circuit element package according to still another exemplary embodiment.

FIG. 19 is a view successively illustrating a process of manufacturing a circuit element package according to still another exemplary embodiment.

Referring to portion (a) of FIG. 19, a first insulating layer 131f is formed in a dam shape on an upper surface of a printed circuit board 110f to surround a semiconductor chip 115f and passive elements 117f and 119f that are mounted on the printed circuit board 110f using a dispenser including a storage chamber 211a and a nozzle 216a. The first insulating layer 131f may be formed at a height having a predetermined aspect ratio.

Referring to portion (b) of FIG. 19, a second insulating layer 133f is formed by injecting an insulating material into the first insulating layer 131f using another dispenser including a storage chamber 2211b and a nozzle 216b. The first insulating layer 131f forms a side surface of the insulating layer, and the second insulating layer 133f forms an upper surface of the insulating layer.

Because a material of the second insulating layer 133f has a viscosity that is lower than the viscosity of a material of the first insulating layer 131f, the second insulating layer 133f has fluidity that is higher than the fluidity of the first insulating layer 131f. Accordingly, an insulating material that is injected from the nozzle 216b to the inside of the first insulating layer 131f can completely fill a gap between the semiconductor chip 115f and the passive elements 117f and 119f and the printed circuit board 110f. If the injection is completed, the second insulating layer 133f is cured to have a predetermined hardness.

Referring to portion (c) of FIG. 19, a first shielding layer 121f is formed to surround the first insulating layer 131f using still another dispenser including a storage chamber 211c and a nozzle 216c. In this case, because the first shielding layer 121f is formed depending on the first insulating layer 131f, the first shielding layer 121f may be formed with a higher height than the height in the case in which the first shielding layer 121f is singly formed.

Referring to portion (d) of FIG. 19, a second shielding layer 123f is spread on the upper surface of the second insulating layer 133f using still another dispenser including a storage chamber 211d and a nozzle 216d. In this case, the second shielding layer 123f may be spread to be electrically connected to the first insulating layer 121f, and thus a ground path is extended from the first insulating layer 121f connected to a ground pad to the second shielding layer 123f to secure electrical stability.

Figure 20:
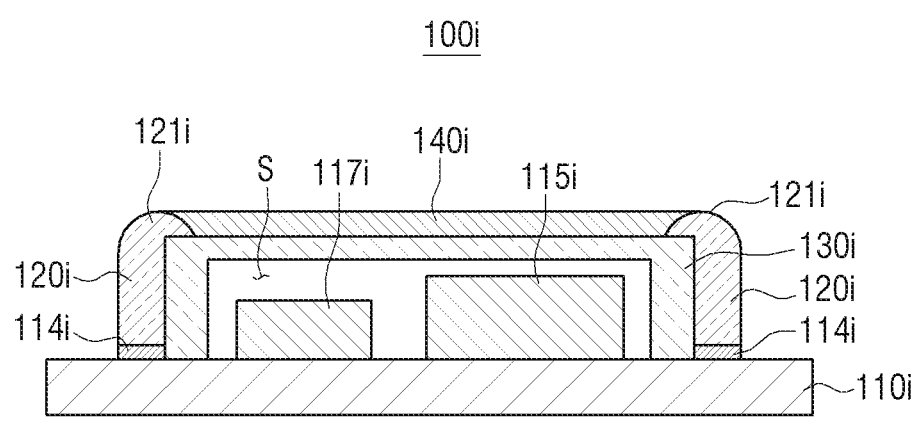
FIG. 20 is a cross-sectional view illustrating a circuit element package according to still another exemplary embodiment.
Figure 21A:
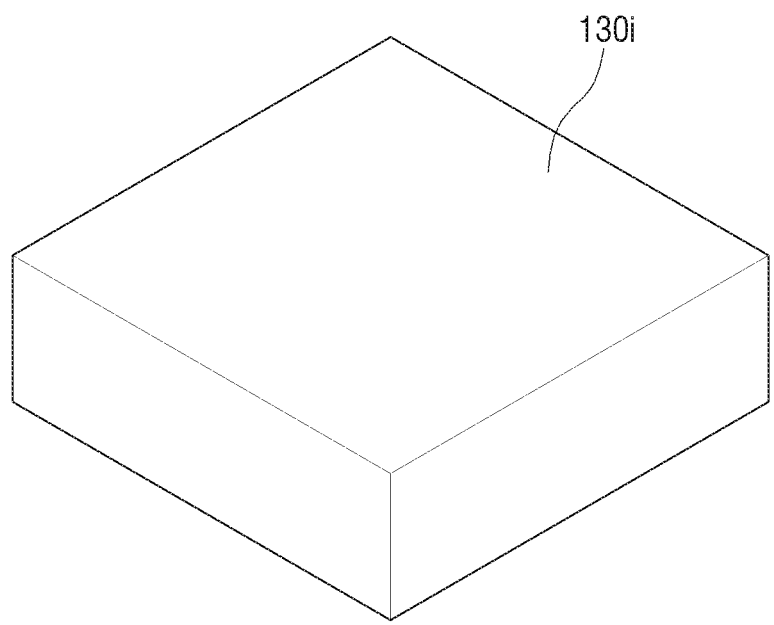
FIGS. 21A and 21B are perspective views illustrating an upper portion and a lower portion of an insulating mold illustrated in FIG. 20.
Figure 21B:
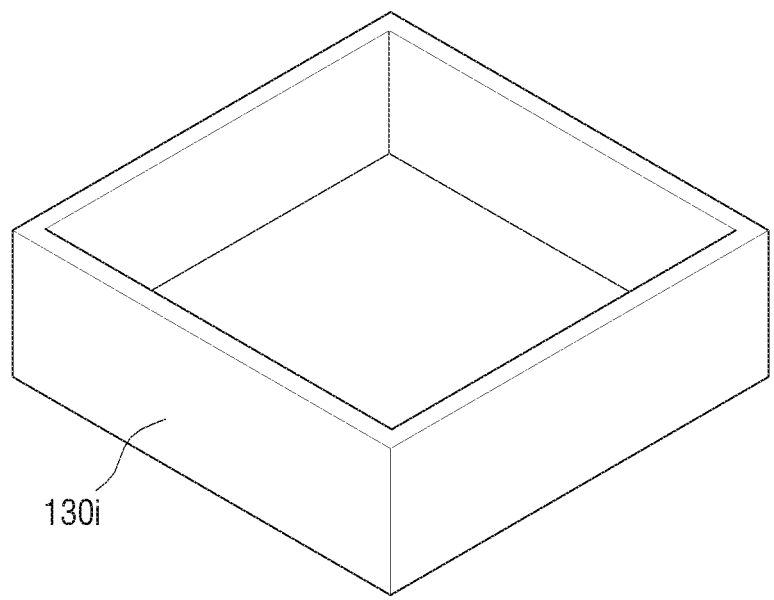

FIG. 20 is a cross-sectional view illustrating a circuit element package 100i according to still another exemplary embodiment, and FIGS. 21A and 21B are perspective views illustrating an upper portion and a lower portion of an insulating mold 130i illustrated in FIG. 20.

Referring to FIG. 20, in the circuit element package 100i, first and second connection pads and a ground pad 114i may be patterned on a printed circuit board 110i.

A semiconductor chip 115i may include a plurality of connection terminals that are electrically connected to the first connection pad of the printed circuit board 110i. A passive element 117i may include at least one connection terminal that is electrically connected to the second connection pad of the printed circuit board 110i. The semiconductor chip 115i and the passive element 117i may be isolated from first and second shielding layers 120i and 140i by an insulating layer 130i of a first shielding layer 120i.

A plurality of connection terminals of the first and second connection pads, the ground pad, and the semiconductor chip 115i may be provided in the same manner as the first and second connection pads 111 and 112, the ground pad 114, and the plurality of connection terminals 116 as illustrated in FIG. 1.

Referring to FIGS. 21A and 21B, the insulating layer 130i of the circuit element package 100i may not be formed by injecting a material using a dispenser, but the insulating mold 130i that is in a box shape having an open bottom surface may be applied to the circuit element package 100i.

Referring again to FIG. 20, the insulating mold 130i is seated on the printed circuit board 110i so that the open bottom surface thereof is directed toward the printed circuit board 110i. In this case, the semiconductor chip 115i and the passive element 117i are positioned in an inner space S of the insulating mold 130i.

The first shielding layer 120i is laminated on the upper surface of the ground pad 114i, and is formed along the periphery of the insulating mold 130i based on the side surface of the insulating mold 130i. In this case, because the first shielding layer 120i is formed depending on the insulating mold 130i, the first shielding layer 120i may be formed with a higher height that the height in the case in which the first shielding layer 120i is singly formed.

In this case, the first shielding layer 120i is formed so that an upper end portion 121i of the first shielding layer 120i reaches the peripheral portion of the upper surface of the insulating mold 130i. Accordingly, the upper end portion 121*i* of the first shielding layer 120*i* is formed to be higher than the upper surface of the insulating mold 130*i* to serve as a dam.

On the upper surface of the insulating mold 130*i*, the second shielding layer 140*i* is formed on the inside of the upper end portion 121*i* of the first shielding layer 120*i*. The second shielding layer 140*i* may be formed in a manner that a material that is injected through a dispenser fills the inside of the upper end portion 121*i* of the first shielding layer 120*i*. In this case, because the second shielding layer 140*i* is formed in a state in which it is naturally connected to the first shielding layer 120*i*, a ground path is extended from the first shielding layer 120*i* to the second insulating layer 140*i* to secure electrical stability.

As described above, because the circuit element package 100*i* does not form the insulating layer through injection of the insulating material through the dispenser, but forms the insulating layer using the prepared insulating mold 130*i*, the process of injecting the insulating layer through the dispenser and curing the injected insulating layer can be omitted, and thus the production yield can be reduced to greatly shorten the production time.

Figure 22:
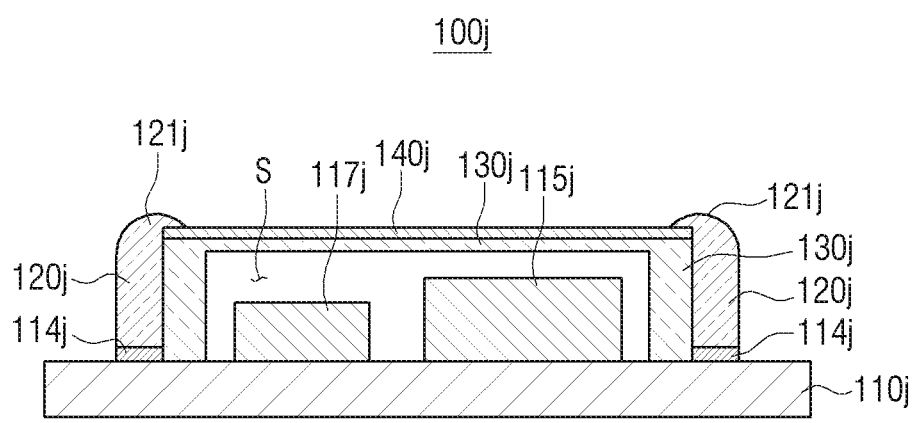
FIG. 22 is a cross-sectional view illustrating a circuit element package according to still another exemplary embodiment.

FIG. 22 is a cross-sectional view illustrating a circuit element package 100*j* according to still another exemplary embodiment.

Referring to FIG. 22, in the circuit element package 100*j*, first and second connection pads and a ground pad 114*j* may be patterned on a printed circuit board 110*j*.

A semiconductor chip 115*j* may include a plurality of connection terminals that are electrically connected to the first connection pad of the printed circuit board 110*j*. A passive element 117*j* may include at least one connection terminal that is electrically connected to the second connection pad of the printed circuit board 110*j*. The semiconductor chip 115*j* and the passive element 117*j* may be isolated from first and second shielding layers 120*j* and 140*j* by an insulating layer 130*j* of the first shielding layer 120*j*.

A plurality of connection terminals of the first and second connection pads, the ground pad, and the semiconductor chip 115*j* may be provided in the same manner as the first and second connection pads 111 and 112, the ground pad 114, and the plurality of connection terminals 116 as illustrated in FIG. 1.

The insulating layer 130*j* of the circuit element package 100*j* may be formed by applying an insulating mold 130*j* that is in a box shape having an open bottom surface in the same manner as the circuit element package 100*i* as described above. The insulating mold 130*j* is seated on the printed circuit board 110*j* so that the open bottom surface thereof is directed toward the printed circuit board 110*j*. In this case, the semiconductor chip 115*j* and the passive element 117*j* are positioned in an inner space S of the insulating mold 130*j*.

On the upper surface of the insulating mold 130*j*, the second shielding layer 140*j* is formed. In this case, the second shielding layer 140*j* may be a shielding film, and an adhesive layer may be formed on a bottom surface of the shielding film so that the shielding film can be attached to the upper surface of the insulating mold 130*j*.

The first shielding layer 120*j* is laminated on the upper surface of the ground pad 114*j*, and is formed along the periphery of the insulating mold 130*j* based on the side surface of the insulating mold 130*j*. In this case, because the first shielding layer 120*j* is formed depending on the insulating mold 130*j*, the first shielding layer 120*j* may be formed with a higher height than the height in the case in which the first shielding layer 120*j* is singly formed. An upper end portion 121*j* of the first shielding layer 120*j* is formed up to the peripheral portion of the upper surface of the second shielding layer 140*j*. Accordingly, the second shielding layer 140*j* is naturally connected to the first shielding layer 120*j*, and thus a ground path is extended from the first shielding layer 120*j* to the second shielding layer 140*j* to secure electrical stability.

As described above, because the circuit element package 100*j* uses the prepared insulating mold 130*j*, the process of injecting the insulating layer through the dispenser and curing the injected insulating layer can be omitted, and thus the production yield can be reduced to greatly shorten the production time.

Figure 23:
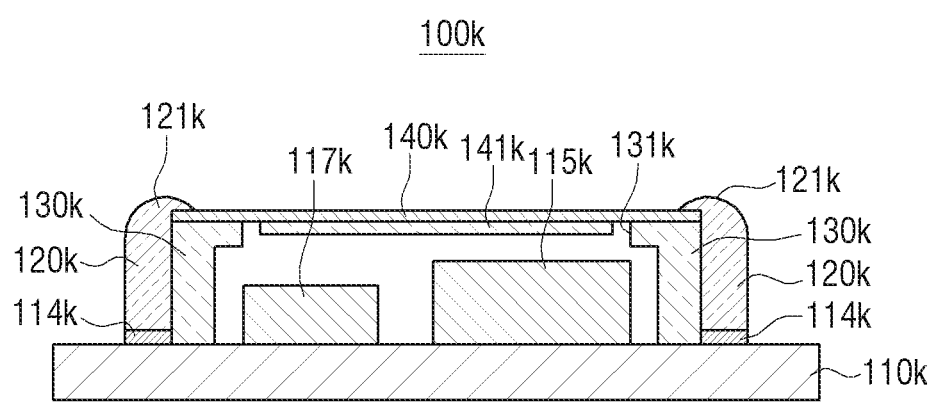
FIG. 23 is a cross-sectional view illustrating a circuit element package according to still another exemplary embodiment.
Figure 24:
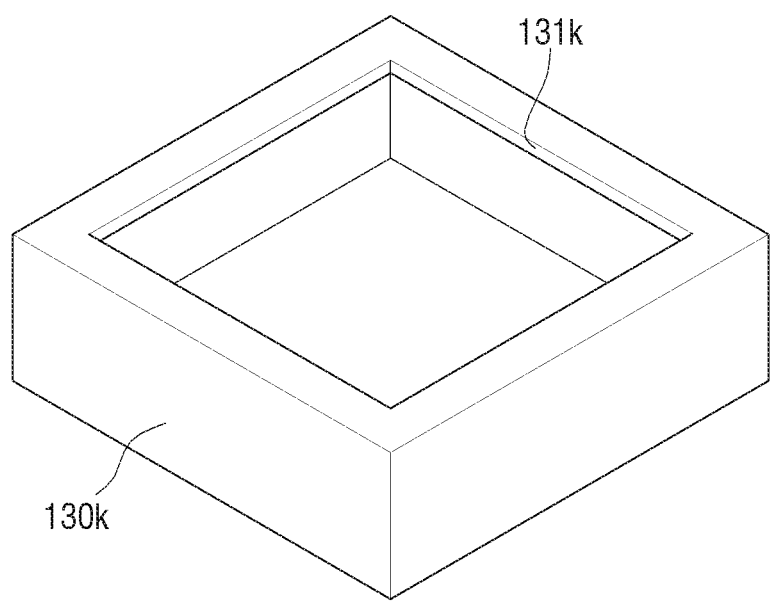
FIG. 24 is a perspective view illustrating an insulating mold illustrated in FIG. 23.

FIG. 23 is a cross-sectional view illustrating a circuit element package 100*k* according to still another exemplary embodiment, and FIG. 24 is a perspective view illustrating an insulating mold 130*k* illustrated in FIG. 23.

Referring to FIG. 23, in the circuit element package 100*k*, first and second connection pads and a ground pad 114*k* may be patterned on a printed circuit board 110*k*.

A semiconductor chip 115*k* may include a plurality of connection terminals that are electrically connected to the first connection pad of the printed circuit board 110*k*. A passive element 117*k* may include at least one connection terminal that is electrically connected to the second connection pad of the printed circuit board 110*k*. The semiconductor chip 115*k* and the passive element 117*k* may be isolated from first and second shielding layers 120*k* and 140*k* by an insulating layer 130*k* of the first shielding layer 120*k*.

A plurality of connection terminals of the first and second connection pads, the ground pad, and the semiconductor chip 115*k* may be provided in the same manner as the first and second connection pads 111 and 112, the ground pad 114, and the plurality of connection terminals 116 as illustrated in FIG. 1.

Referring to FIG. 24, the insulating layer 130*k* of the circuit element package 100*k* may be formed by applying the insulating mold 130*k* that is substantially in a rectangular frame shape having open bottom and upper surfaces.

Referring again to FIG. 23, the insulating mold 130*k* is seated on the printed circuit board 110*k* so that the open bottom surface thereof is directed toward the printed circuit board 110*k*. In this case, the semiconductor chip 115*k* and the passive element 117*k* are positioned in an inner space of the insulating mold 130*k*.

On a peripheral portion of an upper surface of the insulating mold 130*k*, a second shielding layer 140*k* is seated. In this case, an adhesive layer may be formed on a peripheral portion of a bottom surface of the second shielding layer 140*k* to improve a bonding force with the insulating mold 130*k*.

The second shielding layer 140*k* may be a shielding film, and an adhesive layer may be formed on a bottom surface of the shielding film so that the shielding film can be attached to the upper surface of the insulating mold 130*k*. The second shielding layer 140*k* closes an opening 131*k* that is formed on the upper surface of the insulating mold 130*k*. In this case, an insulating film 141*k* having an area that corresponds to or is somewhat smaller than an area of the opening 131*k* is formed on a bottom surface of the second shielding layer 140*k*. The insulating film 141*k* covers upper portions of the semiconductor chip 115 and the passive element 117*k*. Accordingly, the insulating film 141*k* can prevent the second shielding layer 140*k* from being short-circuited to the semiconductor chip 115*k* and the passive element 117*k*.

The first shielding layer 120*k* is laminated on the upper surface of the ground pad 114*k*, and is formed along the periphery of the insulating mold 130*k* based on the side surface of the insulating mold 130*k*. In this case, because the first shielding layer 120*k* is formed depending on the insulating mold 130*k*, the first shielding layer 120*k* may be formed with a higher height than the height in the case in which the first shielding layer 120*k* is singly formed. An upper end portion 121*k* of the first shielding layer 120*k* is formed up to the peripheral portion of the upper surface of the second shielding layer 140*k*. Accordingly, the second shielding layer 140*k* is naturally connected to the first shielding layer 120*k*, and thus a ground path is extended from the first shielding layer 120*k* to the second shielding layer 140*k* to secure electrical stability.

As described above, because the circuit element package 100*k* uses the prepared insulating mold 130*k*, the process of injecting the insulating layer through the dispenser and curing the injected insulating layer can be omitted, and thus the production yield can be reduced to greatly shorten the production time.

Figure 25:
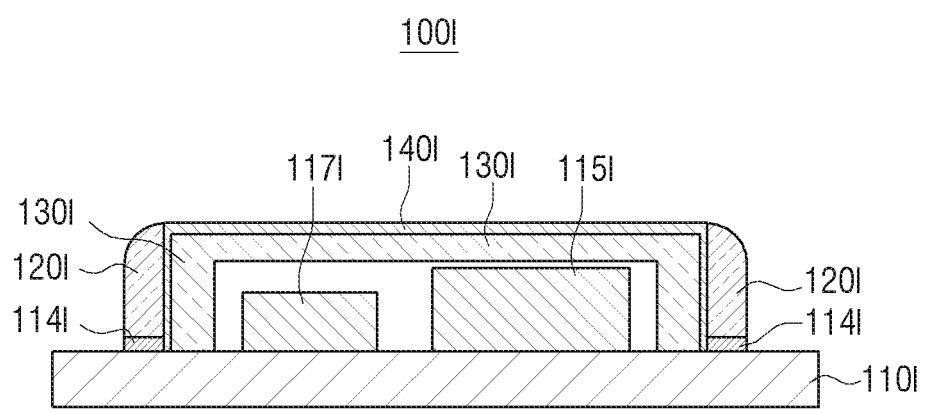
FIG. 25 is a cross-sectional view illustrating a circuit element package according to still another exemplary embodiment.

FIG. 25 is a cross-sectional view illustrating a circuit element package 100*l* according to still another exemplary embodiment.

Referring to FIG. 25, in the circuit element package 100*l*, first and second connection pads and a ground pad 114*l* may be patterned on a printed circuit board 110*l*.

A semiconductor chip 115*l* may include a plurality of connection terminals that are electrically connected to the first connection pad of the printed circuit board 110*l*. A passive element 117*l* may include at least one connection terminal that is electrically connected to the second connection pad of the printed circuit board 110*l*. The semiconductor chip 115*l* and the passive element 117*l* may be isolated from first and second shielding layers 120*l* and 140*l* by an insulating layer 130*l* of the first shielding layer 120*l*.

A plurality of connection terminals of the first and second connection pads, the ground pad, and the semiconductor chip 115*l* may be provided in the same manner as the first and second connection pads 111 and 112, the ground pad 114, and the plurality of connection terminals 116 as illustrated in FIG. 1.

The insulating layer 130*l* of the circuit element package 100*l* may be formed by applying an insulating mold 130*l* that is in a box shape having an open bottom surface in the same manner as the circuit element package 100*i* as described above. The insulating mold 130*l* is seated on the printed circuit board 130*l* so that the open bottom surface thereof is directed toward the printed circuit board 110*l*. In this case, the semiconductor chip 115*l* and the passive element 117*l* are positioned in an inner space S of the insulating mold 130*l*.

On an outer surface, i.e., a side surface and an upper surface, of the insulating mold 130*l*, the second shielding layer 140*l* is formed. The second shielding layer 140*l* may be coated together on the outer surface of the insulating mold 130*l* during manufacturing of the insulating mold 130*l*.

The first shielding layer 120*l* is laminated on the upper surface of the ground pad 114*l*, and is formed along the periphery of the insulating mold 130*l* based on the side surface of the insulating mold 130*l*. In this case, the first shielding layer 120*l* is formed with a height that is not higher than the height of the insulating mold 130*l*. That is, the first shielding layer 120*l* is formed so that the height thereof substantially corresponds to the height of the insulating mold 130*l*.

Because the second shielding layer 140*l* is naturally connected to the first shielding layer 120*l*, a ground path is extended from the first shielding layer 120*l* to the second shielding layer 140*l* to secure electrical stability.

As described above, because the circuit element package 100*l* uses the prepared insulating mold 130*l* and the second shielding layer 140*l* is also pre-coated on the outer surface of the insulating mold 130*l*, the process of injecting the insulating layer and the second shielding layer through the dispenser and curing the injected layers can be omitted, and thus the production yield and the production time can be greatly reduced.

Figure 26:
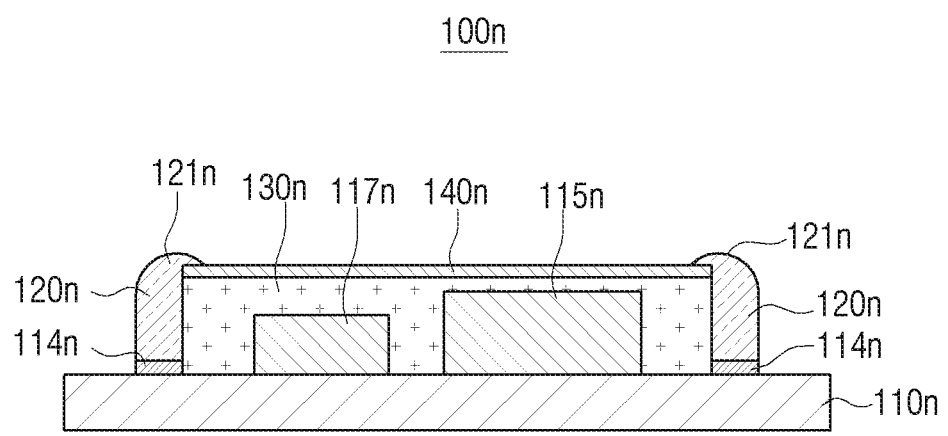
FIG. 26 is a cross-sectional view illustrating a circuit element package according to still another exemplary embodiment.
Figure 27:
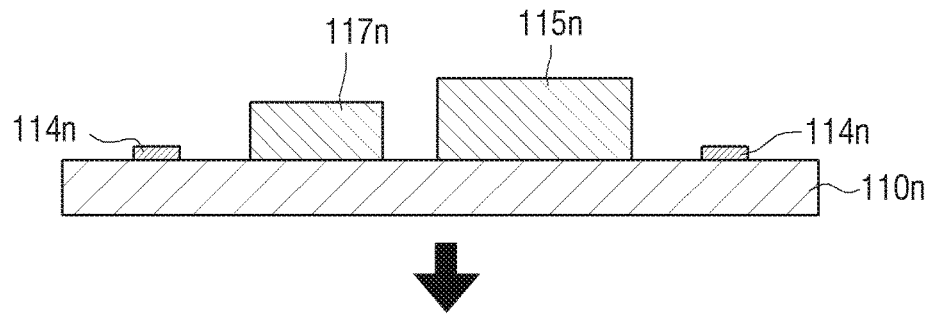
FIG. 27 is a view illustrating a process of manufacturing the circuit element package illustrated in FIG. 26, according to still another exemplary embodiment.
Figure 27:
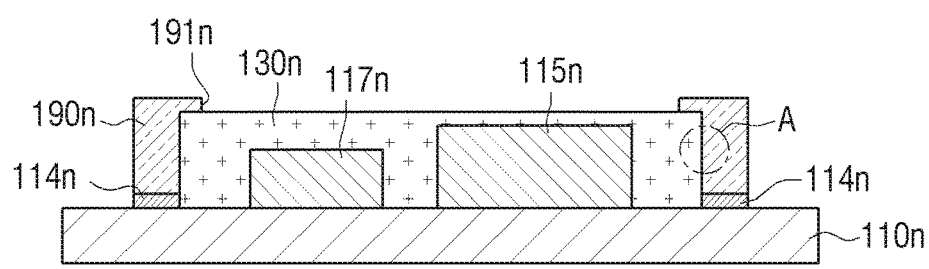
Figure 27:
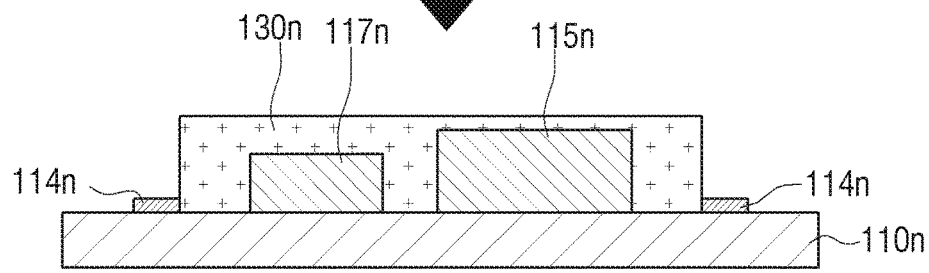
Figure 27:
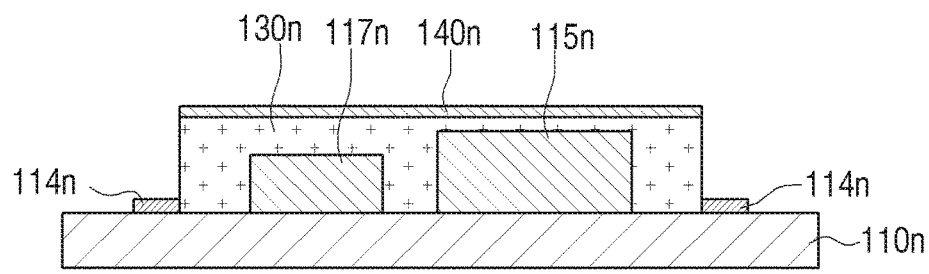
Figure 27:
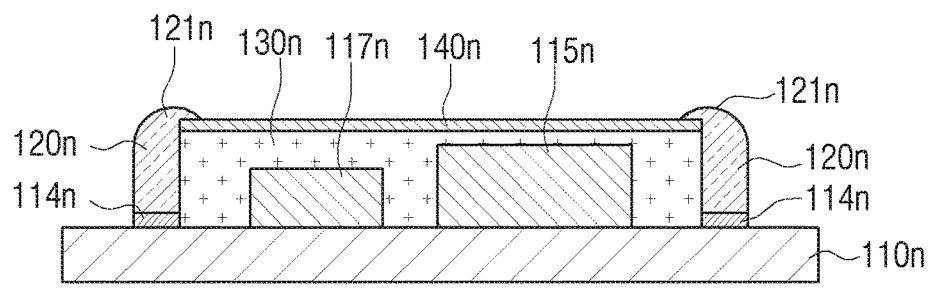
Figure 28:
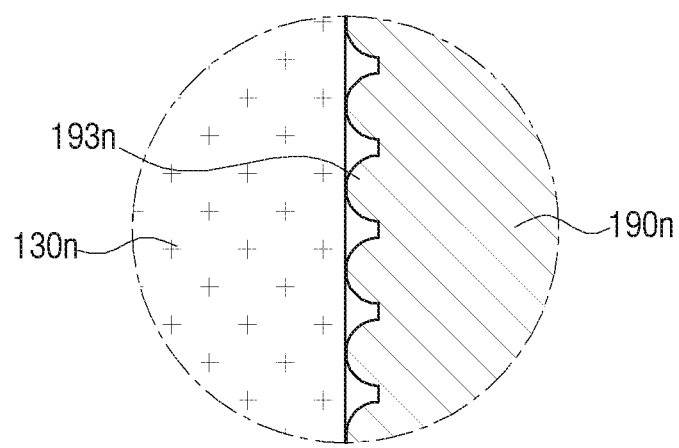
FIG. 28 is an enlarged view illustrating portion "A" in FIG. 27.

FIG. 26 is a cross-sectional view illustrating a circuit element package 100*n* according to still another exemplary embodiment. FIG. 27 is a view illustrating a process of manufacturing the circuit element package 100*n* illustrated in FIG. 26, according to still another exemplary embodiment, and FIG. 28 is an enlarged view illustrating portion "A" in FIG. 27.

Referring to FIG. 26, in the circuit element package 100*n*, first and second connection pads and a ground pad 114*n* may be patterned on a printed circuit board 110*n*.

A semiconductor chip 115*n* may include a plurality of connection terminals that are electrically connected to the first connection pad of the printed circuit board 110*n*. A passive element 117*n* may include at least one connection terminal that is electrically connected to the second connection pad of the printed circuit board 110*n*. The semiconductor chip 115*n* and the passive element 117*n* may be isolated from first and second shielding layers 120*n* and 140*n* by an insulating layer 130*n* of the first shielding layer 120*n*.

A plurality of connection terminals of the first and second connection pads, the ground pad, and the semiconductor chip 115*n* may be provided in the same manner as the first and second connection pads 111 and 112, the ground pad 114, and the plurality of connection terminals 116 as illustrated in FIG. 1.

The insulating layer 130*n* of the circuit element package 100*n* is formed using a separate mold 190*n* before the first shielding layer 120*n* is formed, as illustrated in FIG. 27.

Referring to portion (a) of FIG. 27, connection pads and the ground pad 114*n* are patterned on an upper surface of the printed circuit board 110*n*, and then the semiconductor chip 115*n* and the passive element 117*n* are bonded to be electrically connected to the connection pads.

Referring to portion (b) of FIG. 27, the mold 190*n* with an upper end portion 191*n* is seated on an upper surface of the ground pad 114*n*, and then an insulating material is injected into the mold 190*n* to form the insulating layer 130*n*. The insulating layer 130*n* may be cured to have a predetermined hardness through a curing process after being injected into the mold 190*n*.

Referring to portion (c) of FIG. 27, after the insulating layer 130*n* is cured, the mold 190*n* is separated from the insulating layer 130*n*. In this case, as shown in FIG. 28, the mold 190*n* may be made of a super hydrophobic metal on which a plurality of micro-projections 193*n* are inwardly formed so that the mold 190*n* can be easily separated from the insulating layer 130*n*.

Referring to portion (d) of FIG. 27, the second shielding layer 140*n* is formed on the upper surface of the cured insulating layer 130*n*. The second shielding layer 140*n* may be a shielding film having a predetermined thickness, and may have an area that is substantially equal to the area of the upper surface of the insulating layer 130*n*. In this case, because adhesives are spread on the bottom surface of the second shielding layer 140*n*, the second shielding layer 140*n* may be attached to the upper surface of the insulating layer 130*n*.

Referring to portion (e) of FIG. 27, because the first shielding layer 120n is formed depending on the insulating layer 130n, an upper end portion 121n of the first shielding layer 120n is formed up to the peripheral portion of the upper surface of the second shielding layer 140n. Accordingly, the second shielding layer 140n is naturally connected to the first shielding layer 120n, and thus a ground path is extended from the first shielding layer 120n to the second shielding layer 140n to secure electrical stability.

Figure 29:
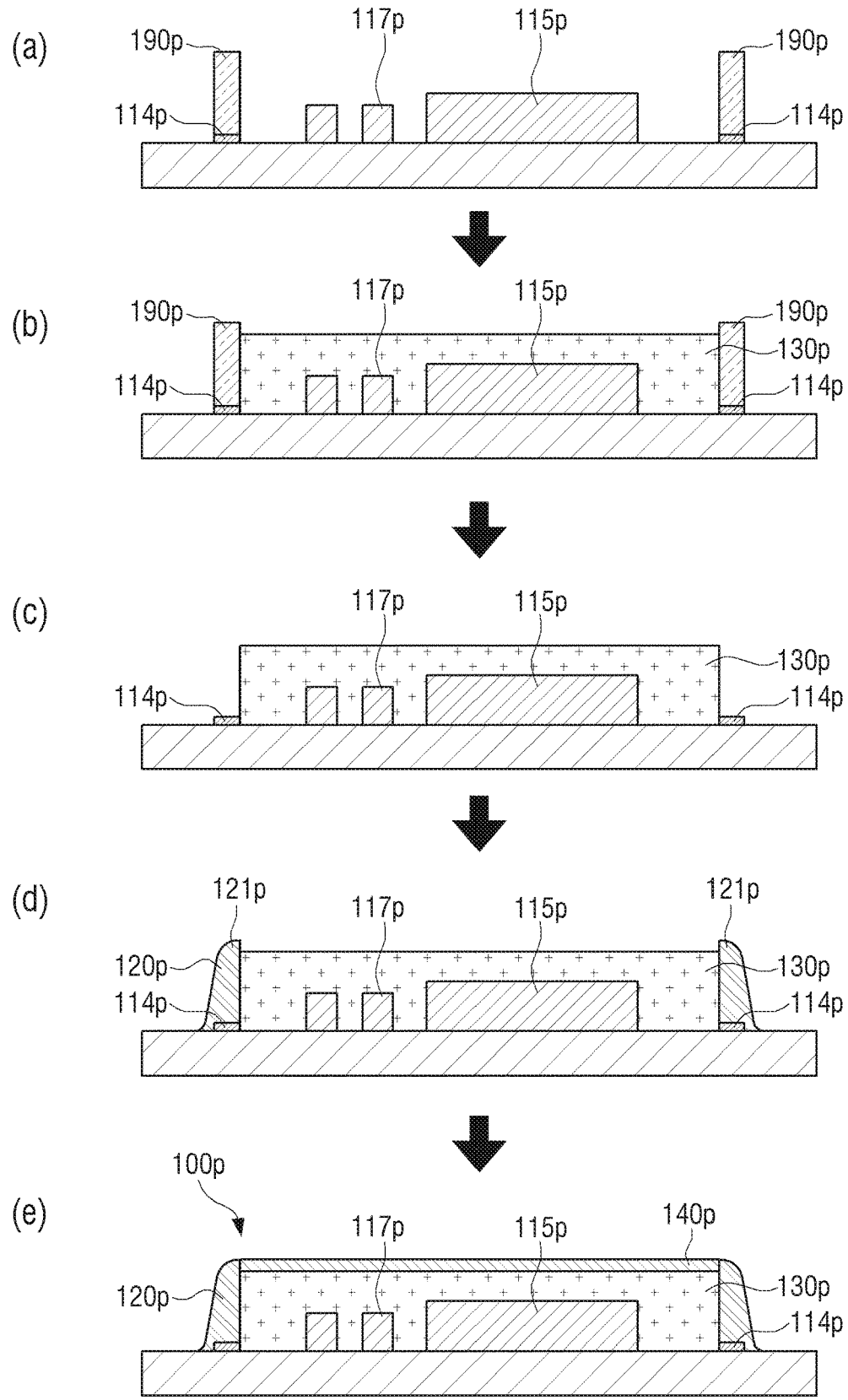
FIG. 29 is a view illustrating a process of manufacturing a circuit element package according to still another exemplary embodiment.

FIG. 29 is a view illustrating a process of manufacturing a circuit element package 100p according to still another exemplary embodiment.

Referring to portion (e) of FIG. 29, in the circuit element package 100p, first and second connection pads and a ground pad 114p may be patterned on a printed circuit board 110p.

A semiconductor chip 115p may include a plurality of connection terminals that are electrically connected to the first connection pad of the printed circuit board 110p. A passive element 117p may include at least one connection terminal that is electrically connected to the second connection pad of the printed circuit board 110p. The semiconductor chip 115p and the passive element 117p may be isolated from first and second shielding layers 120p and 140p by an insulating layer 130p of the first shielding layer 120p.

A plurality of connection terminals of the first and second connection pads, the ground pad, and the semiconductor chip 115p may be provided in the same manner as the first and second connection pads 111 and 112, the ground pad 114, and the plurality of connection terminals 116 as illustrated in FIG. 1.

A process of manufacturing the circuit element package 100p is as follows.

Referring to portion (a) of FIG. 29, the connection pads and the ground pad 114p are patterned on an upper surface of the printed circuit board 110p, and then the semiconductor chip 115p and the passive element 117p are bonded to be electrically connected to the connection pads. A mold 190p is seated on an upper surface of the ground pad 114p.

Referring to portion (b) of FIG. 29, an insulating material is injected into the mold 190p to form the insulating layer 130p. The insulating layer 130p may be cured to have a predetermined hardness through a curing process after being injected into the mold 190p.

Referring to portion (c) of FIG. 29, after the insulating layer 130p is cured, the mold 190p is separated from the insulating layer 130p. In this case, the mold 190p may be made of a super hydrophobic metal on which the plurality of micro-projections 193n (of FIG. 28) are inwardly formed so that the mold 190p can be easily separated from the insulating layer 130p.

Referring to portion (d) of FIG. 29, the first shielding layer 120p is formed along the outline of the insulating layer 130p. In this case, because the first shielding layer 120p is formed depending on the insulating layer 130p, the first shielding layer 120p is formed at high height. Accordingly, an upper end portion 121p of the first shielding layer 120p is formed to be higher than the upper surface of the insulating layer 130p.

Referring again to portion (e) of FIG. 29, a material that forms the second shielding layer 140p is injected into a space that is inwardly formed in the upper end portion 121p of the first shielding layer 120p to be cured. As described above, the second shielding layer 140p that is formed on the upper surface of the insulating layer 130p is electrically connected to the upper end portion 121p of the first shielding layer 120p. Accordingly, a ground path is extended from the first shielding layer 120p to the second shielding layer 140p to secure electrical stability.

Figure 30:
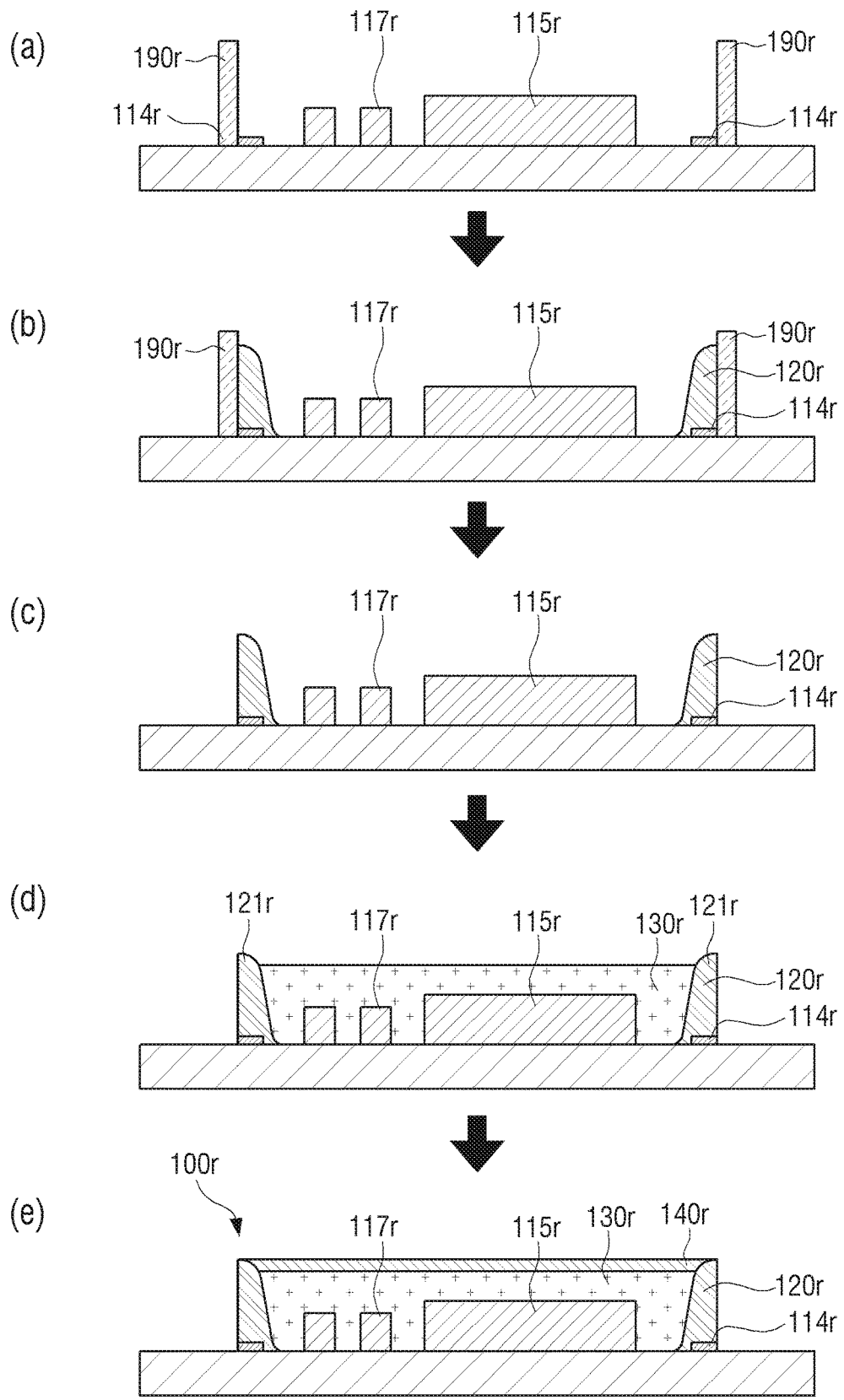
FIG. 30 is a view illustrating a process of manufacturing a circuit element package according to still another exemplary embodiment.

FIG. 30 is a view illustrating a process of manufacturing a circuit element package 100r according to still another exemplary embodiment.

Referring to portion (e) of FIG. 30, in the circuit element package 100r, first and second connection pads and a ground pad 114r may be patterned on a printed circuit board 110r.

A semiconductor chip 115r may include a plurality of connection terminals that are electrically connected to the first connection pad of the printed circuit board 110r. A passive element 117r may include at least one connection terminal that is electrically connected to the second connection pad of the printed circuit board 110r. The semiconductor chip 115r and the passive element 117r may be isolated from first and second shielding layers 120r and 140r by an insulating layer 130r of the first shielding layer 120r.

A plurality of connection terminals of the first and second connection pads, the ground pad, and the semiconductor chip 115r may be provided in the same manner as the first and second connection pads 111 and 112, the ground pad 114, and the plurality of connection terminals 116 as illustrated in FIG. 1.

A process of manufacturing the circuit element package 100r is as follows.

Referring to portion (a) of FIG. 30, the connection pads and the ground pad 114r are patterned on an upper surface of the printed circuit board 110r, and then the semiconductor chip 115r and the passive element 117r are bonded to be electrically connected to the connection pads. Further, a mold 190r is seated on an upper surface of the printed circuit board 110r so that the mold 190r is arranged on an outside of the ground pad 114r.

Referring to portion (b) of FIG. 30, the first shielding layer 120r is formed along an inner surface of the mold 190r, and in this case, the first shielding layer 120r is formed on an upper surface of the ground pad 114r. As described above, the first shielding layer 120r is formed at a high height because the first shielding layer 120r is formed depending on the mold 190r.

Referring to portion (c) of FIG. 30, after the first shielding layer 120r is cured, the mold 190r is separated from the first shielding layer 120r. In this case, the mold 190r may be made of a super hydrophobic metal on which the plurality of micro-projections 193n (of FIG. 28) are inwardly formed so that the mold 190r can be easily separated from the first shielding layer 120r.

Referring to portion (d) of FIG. 30, the insulating layer 130r is cured by injecting an insulating material into a space that is formed inside the first shielding layer 120r. In this case, the insulating layer 130r is injected up to a height enough to have a predetermined space inside an upper end portion 121r of the first shielding layer 120r to form the second shielding layer 140r that is to be formed on the upper surface of the insulating layer 130r later.

Referring to portion (e) of FIG. 30, a material that forms the second shielding layer 140r is injected into a space that is inwardly formed in the upper end portion 121r of the first shielding layer 120r to be cured. As described above, the second shielding layer 140r that is formed on the upper surface of the insulating layer 130r is electrically connected to the upper end portion 121r of the first shielding layer 120r. Accordingly, a ground path is extended from the first shielding layer 120r to the second shielding layer 140r to secure electrical stability.

The foregoing exemplary embodiments are examples and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A circuit element package comprising:
a circuit element disposed on a printed circuit board;
an insulating layer covering the circuit element;
a first shielding layer covering a side surface of the insulating layer, wherein the first shielding layer is made of an electro-conductive resin;
a second shielding layer covering an upper surface of the insulating layer and electrically connected to the first shielding layer; and
an edge bridge disposed between the first shielding layer and the second shielding layer, and electrically connecting the first shielding layer to the second shielding layer,
wherein the second shielding layer is physically separated from the first shielding layer by the edge bridge,
wherein the second shielding layer is made of a same material as the edge bridge, and
wherein the insulating layer fills a gap between a bottom surface of the circuit element and an upper surface of the printed circuit board.

2. The circuit element package as claimed in claim 1, wherein the first shielding layer comprises an electromagnetic shielding material having a viscosity greater than a viscosity of the insulating layer.

3. The circuit element package as claimed in claim 1, wherein the second shielding layer is disposed on an upper surface of the insulating layer and an upper surface of the edge bridge.

4. The circuit element package as claimed in claim 1, wherein the insulating layer comprises an epoxy underfill through which the circuit element is disposed on the printed circuit board, and
wherein the circuit element package further comprises gas discharge holes disposed in portions of the first shielding layer and configured to discharge gas that is generated by the epoxy underfill.

5. The circuit element package as claimed in claim 1, further comprising:
a ground pad disposed on the printed circuit board; and
a skirt portion disposed on an upper surface of the ground pad,
wherein the first shielding layer is disposed on an upper surface of the skirt portion.

6. The circuit element package as claimed in claim 1, further comprising an insulating adhesive layer disposed on a bottom surface of the second shielding layer and covering the circuit element having a height greater than a height of the insulating layer.

7. The circuit element package as claimed in claim 1, wherein the insulating layer comprises an insulating mold having an open bottom surface, an open upper surface, and a space disposed in the insulating mold.

8. The circuit element package as claimed in claim 1, wherein the insulating layer is disposed on a bottom surface of the second shielding layer, and
an air gap is disposed inside the first shielding layer.

9. The circuit element package as claimed in claim 1, wherein the second shielding layer comprises through-holes disposed along sides of the second shielding layer, and
the circuit element package further comprises a connection layer disposed along a circumferential portion of an upper surface of the second shielding layer on which the through-holes are disposed, disposed in the through-holes, and electrically connecting the first shielding layer to the second shielding layer.

10. The circuit element package as claimed in claim 1, wherein the electro-conductive resin comprises a cured thixotropic material or a cured hot melt material which include a metal filler, respectively.

11. The circuit element package as claimed in claim 10, wherein the cured thixotropic material is derived from at least one among synthetic fine silica, bentonite, fine particle surface processing calcium carbonate, hydrogenated castor oil, metal soap, aluminum stearate, polyamide wax, polyethylene oxide, and linseed polymerized oil.

12. The circuit element package as claimed in claim 10, wherein the cured hot melt material is derived from at least one among polyurethane, polyurea, polyvinyl chloride, polystyrene, ABS (Acrylonitrile Butadiene Styrene), polyamide, acryl, and PBTP (Polybutylene Terephthalate).

13. The circuit element package as claimed in claim 1, wherein the second shielding layer is made of a same material as the first shielding layer.

* * * * *